US010664017B2

United States Patent
Kim et al.

(10) Patent No.: US 10,664,017 B2
(45) Date of Patent: May 26, 2020

(54) SUPPORT MEMBER AND DISPLAY APPARATUS INCLUDING THE SAME

(71) Applicant: Samsung Display Co., Ltd., Yongin-si (KR)

(72) Inventors: Kyoungtae Kim, Osan-si (KR); Hye-ryoung Park, Hwaseong-si (KR); Youngjin Lee, Hwaseong-si (KR); Sungsu Hong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/217,708

(22) Filed: Dec. 12, 2018

(65) Prior Publication Data
US 2019/0204873 A1 Jul. 4, 2019

(30) Foreign Application Priority Data
Jan. 3, 2018 (KR) .......... 10-2018-0000839

(51) Int. Cl.
*G06F 1/16* (2006.01)
*G09F 9/30* (2006.01)
(Continued)

(52) U.S. Cl.
CPC .......... *G06F 1/1652* (2013.01); *G06F 1/1681* (2013.01); *G06F 3/0412* (2013.01); *G09F 9/301* (2013.01); *G09G 3/3233* (2013.01); *H01L 27/323* (2013.01); *H01L 51/0097* (2013.01); *H01L 51/5237* (2013.01); *H04M 1/0268* (2013.01); *G06F 3/044* (2013.01); *G06F 2203/04102* (2013.01); *G09G 2300/0842* (2013.01)

(58) Field of Classification Search
CPC ............................ G06F 1/1652; G06F 1/1681
USPC .............. 361/679.27, 679.3, 679.54, 679.55
See application file for complete search history.

(56) References Cited

U.S. PATENT DOCUMENTS 9,173,287 B1 * 10/2015 Kim ....................... H05K 1/028
9,348,370 B2 * 5/2016 Song ..................... G06F 1/1681
(Continued)

FOREIGN PATENT DOCUMENTS

EP 3270259 1/2018
KR 10-2018-0007739 1/2018

OTHER PUBLICATIONS

Extended European Search Report dated May 22, 2019, in European Patent Application No. 19150181.6.

*Primary Examiner* — Anthony Q Edwards
(74) *Attorney, Agent, or Firm* — H.C. Park & Associates, PLC

(57) ABSTRACT

A display includes: a first support member (FSM); a second support member (SSM); joint units (JUs) arranged in a first direction (FD), extending in a second direction (SD), and between the FSM and the SSM; and a flexible display module on the FSM, the SSM, and the JUs. Each JU includes: a body part (BP) extending in the SD; and protruding parts (PP) on opposing sides of the BP, each PP having a fan shape (FS) and being on an upper end of the BP. Each PP includes: an arced curved surface (CS), and a first inclined surface (FIS) and a second inclined surface (SIS) defined as radii of the FS. An angle between the FIS and a third direction (TD) is equivalent to an angle formed between the SIS and the TD. The CSs of some PP on a same upper end of the BP face each other.

34 Claims, 24 Drawing Sheets

(51) Int. Cl.
  *G06F 3/041*    (2006.01)
  *H01L 51/00*    (2006.01)
  *H01L 51/52*    (2006.01)
  *H01L 27/32*    (2006.01)
  *H04M 1/02*     (2006.01)
  *G09G 3/3233*   (2016.01)
  *G06F 3/044*    (2006.01)

(56) References Cited

U.S. PATENT DOCUMENTS

| | | | |
|---|---|---|---|
| 10,070,546 B1* | 9/2018 | Hsu | E05D 3/06 |
| 10,234,899 B1* | 3/2019 | Brocklesby | G06F 1/1618 |
| 10,244,641 B2* | 3/2019 | Seo | G06F 1/1641 |
| 10,367,164 B2* | 7/2019 | Ahn | G06F 1/1681 |
| 10,466,747 B2* | 11/2019 | Yun | G06F 1/1641 |
| 10,503,210 B2* | 12/2019 | Lee | H04M 1/0216 |
| 2015/0077917 A1 | 3/2015 | Song | |
| 2016/0139634 A1* | 5/2016 | Cho | G06F 1/1652 |
| | | | 361/679.27 |
| 2018/0020556 A1 | 1/2018 | Seo et al. | |

* cited by examiner

SUPPORT MEMBER AND DISPLAY APPARATUS INCLUDING THE SAME

CROSS-REFERENCE TO RELATED APPLICATION

This application claims priority from and the benefit of Korean Patent Application No. 10-2018-0000839, filed Jan. 3, 2018, which is hereby incorporated by reference for all purposes as if fully set forth herein.

BACKGROUND

Field

Exemplary embodiments generally relate to a support member and a display apparatus including the same, and more particularly, to a support member capable of realizing in-folding and out-folding and a display apparatus including the same.

Discussion

In general, electronic devices to provide an image to a user, such as smartphones, digital cameras, laptop computers, navigation devices, and smart televisions, include a display device to display an image. The display device generates an image to provide the generated image to the user through a display screen. As technologies of the display device are developed, various types of display devices are emerging. For example, a flexible display device is deformable, foldable, and/or rollable into a curved shape. The flexible display device that is deformable into various shapes may be portable, and thus, increase convenience of a user. In the case of a foldable folding display device, since the display device may be folded only in a specific direction, a need exists for a display device that is foldable in both directions.

The above information disclosed in this section is only for understanding the background of the inventive concepts, and, therefore, may contain information that does not form prior art.

SUMMARY

The present disclosure provides a support member capable of realizing in-folding and out-folding and a display apparatus including the same.

Additional aspects will be set forth in the detailed description which follows, and, in part, will be apparent from the disclosure, or may be learned by practice of the inventive concepts.

According to some exemplary embodiments, a display apparatus includes a first support member, a second support member, joint units, and a display module. The second support member is arranged in a first direction from the first support member. The joint units are arranged in the first direction, extend in a second direction crossing the first direction, and are disposed between the first and second support members. The display module is disposed on the first and second support members and the joint units. The display module is flexible. Each of the joint units includes: a body part extending in the second direction; and protruding parts disposed on opposing sides of the body part when viewed in the first direction, each of the protruding parts having a fan shape and being disposed on a corresponding upper end of the body part when viewed in the second direction. Each of the protruding parts includes: a curved surface defined as an arc of the fan shape; a first inclined surface defined as a first radii of the fan shape; and a second inclined surface defined as a second radii of the fan shape. An angle formed between the first inclined surface and a third direction perpendicular to a plane parallel with the first and second directions is equivalent to an angle formed between the second inclined surface and the third direction. The curved surfaces of some of the protruding parts that are disposed on a same upper end of the body part face each other.

According to some exemplary embodiments, a display apparatus includes a first support member, a second support member, joint units, and a display module. The second support member is arranged in a first direction from the first support member. The joint units are arranged in the first direction, extend in a second direction crossing the first direction, and are disposed between the first and second support members. The display module is disposed on the first and second support members and the joint units. The display module is flexible. Each of the joint units includes: a first body part extending in the second direction; first guide parts disposed on opposing sides of the first body part when viewed in the first direction; and protruding parts disposed on opposing sides of the first guide parts when viewed in the second direction, each of the protruding parts having a fan shape. Each of the protruding parts includes: a curved surface defined as an arc of the fan shape; a first inclined surface defined as a first radii of the fan shape; and a second inclined surface defined as a second radii of the fan shape. An angle formed between the first inclined surface and a third direction perpendicular to a plane parallel with the first and second directions is equivalent to an angle formed between the second inclined surface and the third direction. The curved surfaces of the protruding parts respectively disposed on opposing sides of each of the first guide parts face each other.

According to some exemplary embodiments, a support member includes a first support member, a second support member, joint units, and connecting units. The second support member is arranged in a first direction from the first support member. The joint units are arranged in the first direction, extend in a second direction crossing the first direction, and are disposed between the first and second support members. The connecting units couple the first support member, the second support member, and the joint units to each other in a mutually rotatable manner. Each of the joint units includes: a body part extending in the second direction; and protruding parts disposed on opposing sides of the body part when viewed in the first direction, each of the protruding parts having a fan shape and being disposed on opposing sides of an upper end of the body part when viewed in the second direction. Each of the protruding parts includes: a curved surface defined as an arc of the fan shape; a first inclined surface defined as a first radii of the fan shape; a second inclined surface defined as a second radii of the fan shape. The curved surfaces of some of the protruding parts that are disposed on the upper end of the body part face each other. An angle formed between the first inclined surface and a third direction perpendicular to a plane parallel with the first and second directions is equivalent to an angle formed between the second inclined surface and the third direction. The first protruding part of a first joint unit of the joint units and the second protruding part of a second joint unit of the joint units that is adjacent to the first joint unit are disposed in a connecting unit of the connecting units.

According to various exemplary embodiments, a display apparatus may be capable of realizing in-folding and out-folding by the joint units of the support member, and the in-folding or out-folding display apparatus may be restored to a flat state by elastic members disposed at the joint units of a support member.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
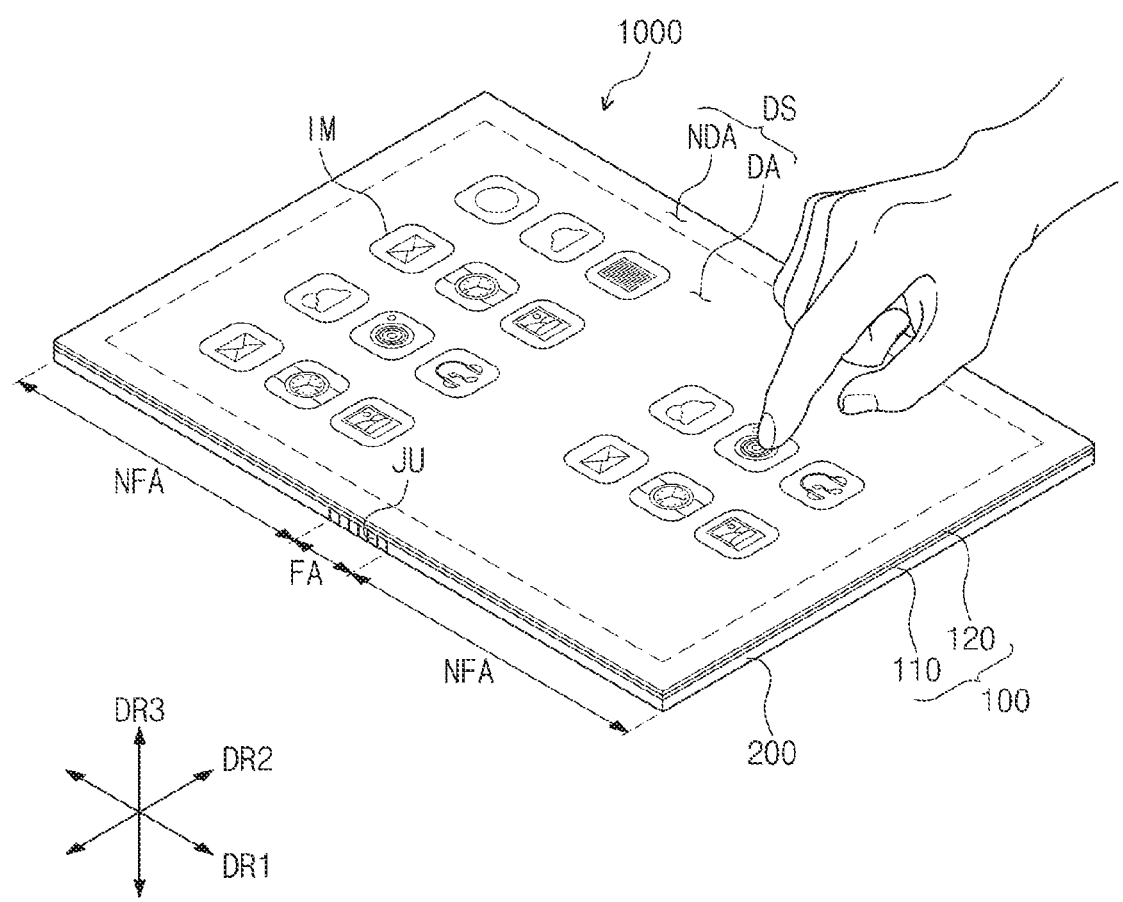
FIG. 1 is a perspective view of a display apparatus according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. Further, the D1-axis, the D2-axis, and the D3-axis are not limited to three axes of a rectangular coordinate system, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and/or the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Figure 2:
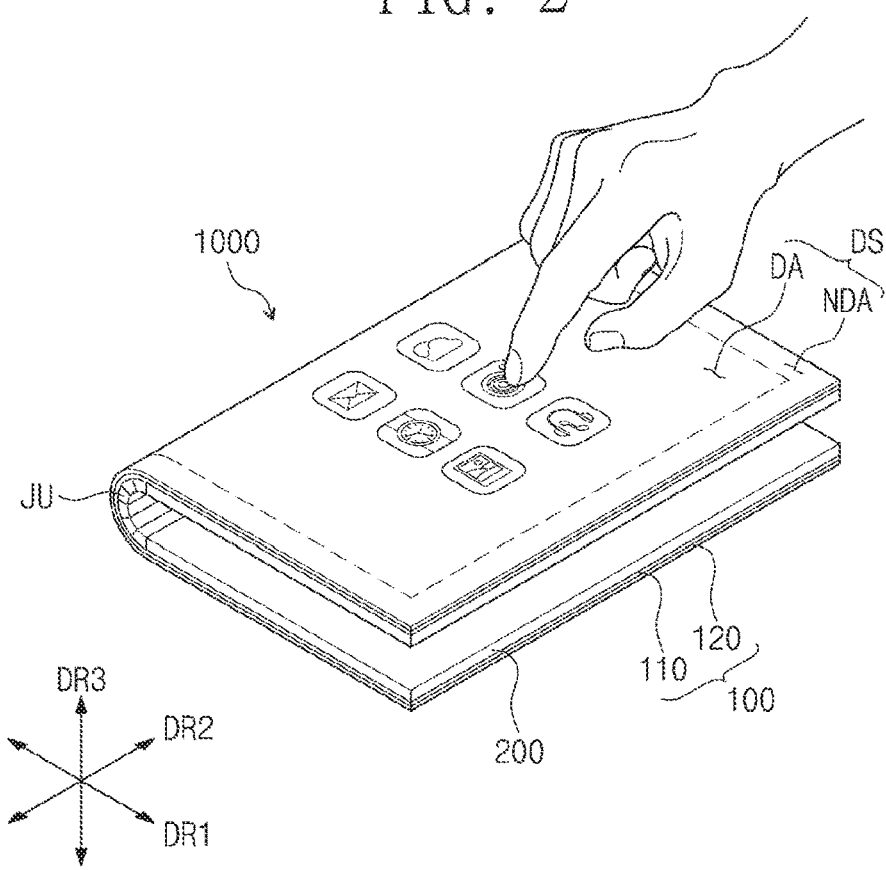
FIG. 2 is a view illustrating a state in which the display apparatus in FIG. 1 is out-folded according to some exemplary embodiments.
Figure 3:
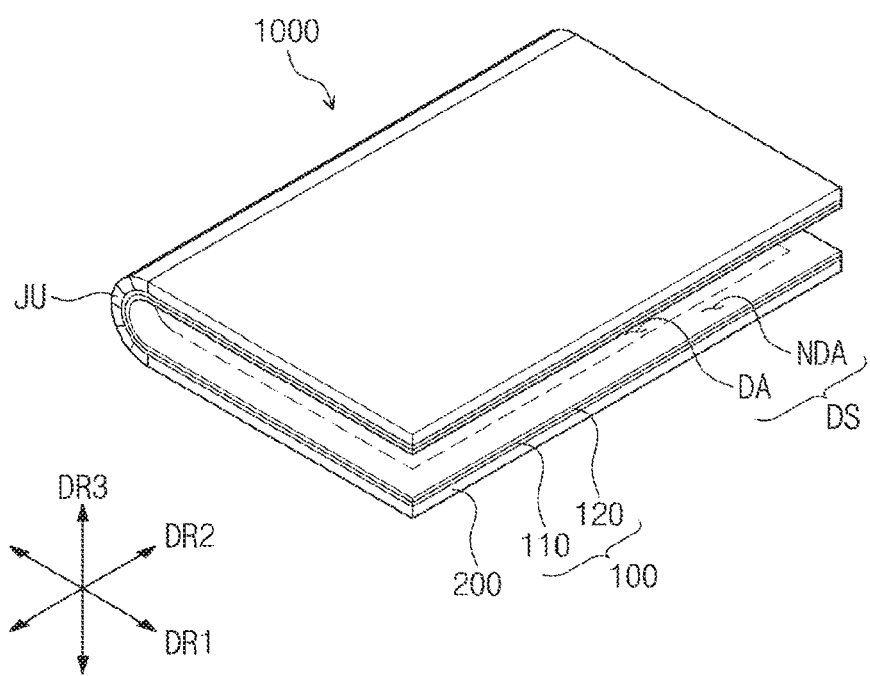
FIG. 3 is a view illustrating a state in which the display apparatus in FIG. 1 is in-folded according to some exemplary embodiments.

FIG. 1 is a perspective view of a display apparatus according to some exemplary embodiments. FIG. 2 is a view illustrating a state in which the display apparatus in FIG. 1 is out-folded according to some exemplary embodiments. FIG. 3 is a view illustrating a state in which the display apparatus in FIG. 1 is in-folded according to some exemplary embodiments.

Referring to FIGS. 1, 2, and 3, a display apparatus 1000 according to some exemplary embodiments may have long sides in a first direction DR1 and short sides in a second direction DR2 crossing the first direction DR1. However, exemplary embodiments are not limited thereto. For example, the display apparatus 1000 may have various shapes. The display apparatus 1000 may be, as a flexible display apparatus 1000, a foldable display apparatus 1000 that is foldable or unfoldable.

The display apparatus 1000 may be divided into a plurality of areas according to the folding. For example, the display apparatus 1000 may be divided into a folding area FA in which the display apparatus 1000 is folded and two non-folding areas NFA that are in a flat state. The non-folding areas NFA are arranged in the first direction DR1, and the folding area FA is disposed between the two non-folding areas NFA.

As the folding area FA of the display apparatus 1000 is folded, the non-folding areas NFA may be folded to face each other. Although one folding area FA is defined in the display apparatus 1000 as shown in FIGS. 1-3, exemplary embodiments are not limited thereto. For example, a plurality of folding areas may be defined in the display apparatus 1000.

The display apparatus 1000 includes a display module 100 having flexibility and a support member 200 disposed below the display module 100. The display module 100 may have a top surface that is defined as a display surface DS and may be a plane in parallel to the first direction DR1 and the second direction DR2. Through the display surface DS, images IM generated by the display module 100 may be provided to a user.

The display surface DS includes a display area DA and a non-display area NDA disposed outside (e.g., around) the display area DA. The display area DA may display an image, and the non-display area NDA may not display an image. The non-display area NDA may surround the display area DA and define an edge, which is printed in a determined color, of the display apparatus 1000

The display module 100 includes a display panel 110 and a touch sensing unit 120 disposed on the display panel 110. The display panel 110 may generate an image to provide the generated image to the user. The display panel 110 may be a liquid crystal display panel, an organic light emitting display panel, an electrophoretic display panel, or an electrowetting display panel, or any one of various display panels capable of displaying an image.

The touch sensing unit 120 may sense an external input (user's hands, touch pen, etc.) to convert the external input into a predetermined input signal and provide the input signal to the display panel 110. The touch sensing unit 120 may include a plurality of touch sensor parts (not shown) to sense an external input. The touch sensor parts may sense an external input in a capacitive manner. The display panel 110 may receive an input signal from the touch sensing unit 120 to generate an image corresponding to the input signal.

The support member 200 may support the display module 100 and rotate to be folded by joint units JU coupled to rotate each other. As the support member 200 is folded, the display module 100 having flexibility may be folded by the support member 200. The support member 200 may out-fold the display apparatus 1000 to expose the display module 100 to the outside. Also, the support member 200 may in-fold the display apparatus 1000 so that the display module 100 is not exposed to the outside.

Hereinafter, a configuration of the support member 200 will be described in more detail with reference to FIGS. 6 to 15. Hereinafter, a direction crossing a plane in parallel to the first direction DR1 and the second direction DR2 is defined as a third direction DR3. The third direction DR3 may be a direction crossing the plane in parallel to the first direction DR1 and the second direction DR2 in a perpendicular manner.

Figure 4:
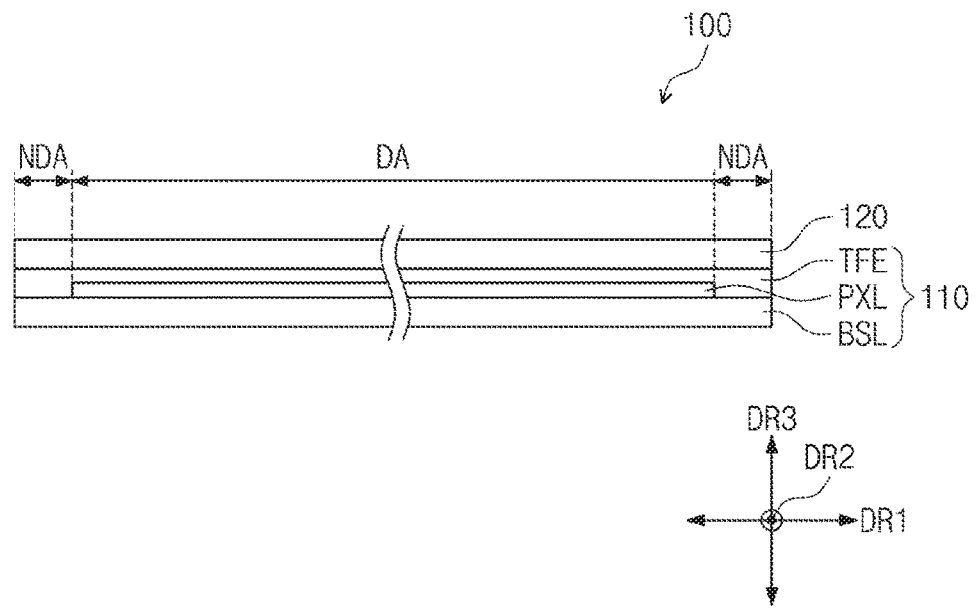
FIG. 4 is a view illustrating a cross-sectional configuration of the display apparatus in FIG. 1 according to some exemplary embodiments.

FIG. 4 is a view illustrating a cross-sectional configuration of the display apparatus in FIG. 1 according to some exemplary embodiments.

Referring to FIG. 4, the display panel 110 includes a base layer BSL, a pixel layer PXL disposed on the base layer BSL, and a thin-film encapsulation layer TFE disposed on the base layer BSL to cover the pixel layer PXL. The base layer BSL may define a rear surface of the display module 100 and have flexibility.

The pixel layer PXL may include a plurality of pixels (not shown) and may be driven by receiving an electrical signal to generate the images IM. The thin-film encapsulation layer TFE may protect the pixel layer PXL, and the touch sensing unit 120 is disposed on the thin-film encapsulation layer TFE. The thin-film encapsulation layer TFE may be formed in multi-layers and include an organic insulation film and/or an inorganic insulation film.

Figure 5:
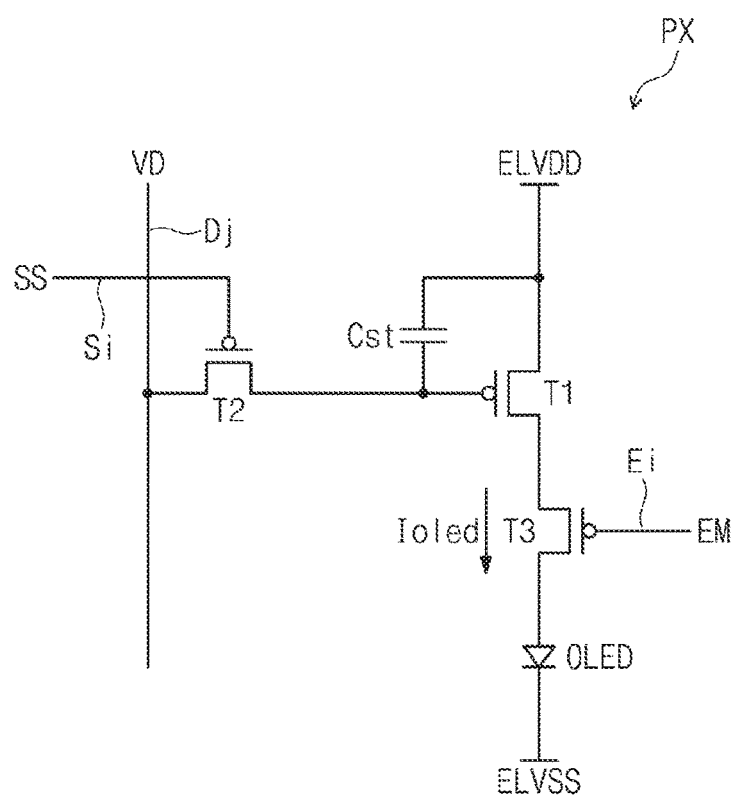
FIG. 5 is an equivalent circuit diagram of an arbitrary pixel of pixels disposed in a pixel layer in FIG. 4 according to some exemplary embodiments.

FIG. 5 is an equivalent circuit diagram of an arbitrary pixel of pixels disposed in a pixel layer in FIG. 4 according to some exemplary embodiments.

Although a configuration of one pixel PX is exemplarily illustrated in FIG. 5, other pixels may have the same configuration as the pixel PX in FIG. 5. In some exemplary embodiments, the pixel PX in FIG. 5 may be an organic light emitting element used in an organic light emitting display panel.

Referring to FIG. 5, the pixel PX is connected to an injection line Si, a data line Dj, and a light emitting line Ei. Here, i and j are natural numbers. The pixel PX includes a light emitting element OLED, a driving transistor T1, a capacitive element Cst, a switching transistor T2, and a light emitting control transistor T3. The light emitting element OLED may be defined as an organic light emitting diode.

The driving transistor T1 has a source terminal receiving a first voltage ELVDD and a drain terminal connected to a source terminal of the light emitting control transistor T3. The driving transistor T1 has a gate terminal connected to a drain terminal of the switching transistor T2.

The switching transistor T2 has a gate terminal connected to the injection line Si and a source terminal connected to the data line Dj. The capacitive element Cst has a first electrode connected to the source terminal of the driving transistor T1 and a second electrode connected to the gate terminal of the driving transistor T1.

The light emitting control transistor T3 has a gate terminal connected to the light emitting line Ei and a drain terminal connected to an anode electrode of the light emitting element OLED. A second voltage ELVSS is applied to a cathode electrode of the light emitting element OLED. The second voltage ELVSS may be less than the first voltage ELVDD.

The switching transistor T2 is turned-on in response to the injection signal SS that is received through the injection line Si. The turned-on switching transistor T2 supplies the data voltage VD that is received through the data line Dj to the gate terminal of the driving transistor T1. The capacitive element Cst charges the data voltage VD that is applied to the gate terminal of the driving transistor T1 and maintains the data voltage VD even after the switching transistor T2 is turned-off.

The gate terminal of the light emitting control transistor T3 is turned-on in response to the light emitting signal EM that is received through the light emitting line Ei. The turned-on light emitting control transistor T3 serves to supply a current $I_{oled}$ flowing in the driving transistor T1 to the light emitting element OLED. The pixel PX may emit light while the light emitting signal EM is applied, and the light emitting element OLED may emit light that is varied in intensity according to an amount of the received current $I_{oled}$.

Although the transistors T1 to T3 of the pixel PX are shown as PMOS transistors, exemplary embodiments are not limited thereto. For example, the transistors T1 to T3 of the pixel PX may be NMOS transistors.

Figure 6:
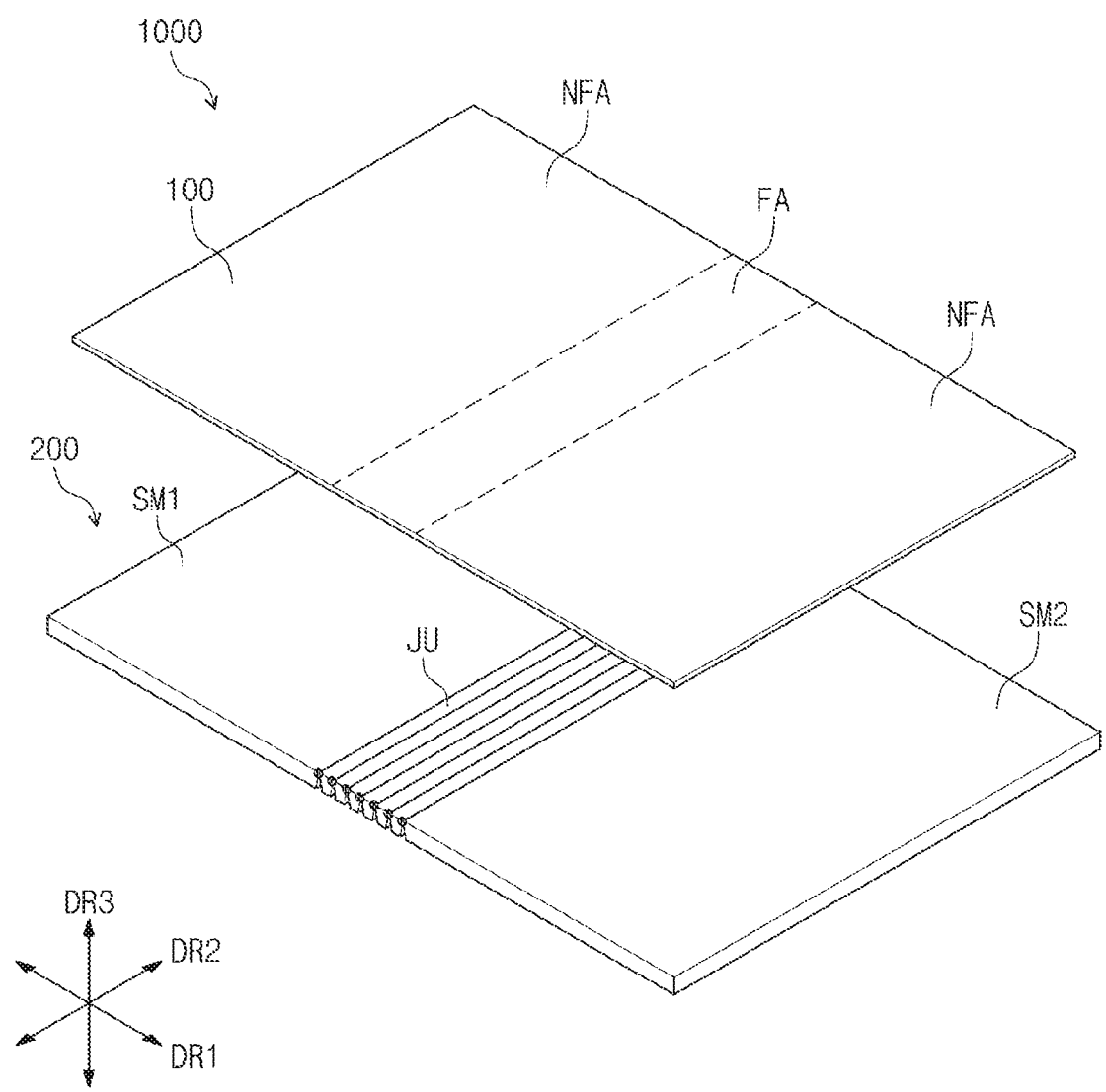
FIG. 6 is a perspective view of a support member in FIG. 1 according to some exemplary embodiments.

FIG. 6 is a perspective view of a support member in FIG. 1 according to some exemplary embodiments.

Referring to FIG. 6, the support member 200 includes a first support member SM1, a second support member SM2, a plurality of joint units JU disposed between the first support member SM1 and the second support member SM2, and a plurality of connecting units CU coupling the first and second support members SM1 and SM2 to the joint units JU. The first support member SM1 and the second support member SM2 are arranged in the first direction DR1. The joint units JU are arranged in the first direction DR1 and extend in the second direction DR2.

The first support member SM1, the second support member SM2, and the joint units JU are coupled to rotate each other by the connecting unit CU. The joint units JU are coupled to rotate each other, and the first support member SM1 is coupled to the joint unit JU disposed adjacent to the first support member SM1 among the joint units JU to rotate each other. The second support member SM2 is coupled to the joint unit JU disposed adjacent to the second support member SM2 among the joint units JU to rotate each other. Rotation shafts for allowing the first support member SM1, the second support member SM2, and the joint units JU to rotate each other may be parallel to the second direction DR2.

The display module 100 is disposed on the first support member SM1, the second support member SM2, and the joint units JU. The folding area FA of the display module 100 may be disposed on the joint units JU, and the non-folding areas NFA of the display module 100 may be disposed on the first and second support members SM1 and SM2, respectively.

As the first support member SM1, the second support member SM2, and the joint units JU rotate each other, the display module 100 may be in-folded or out-folded, and such an operation will be described below in more detail.

Figure 7:
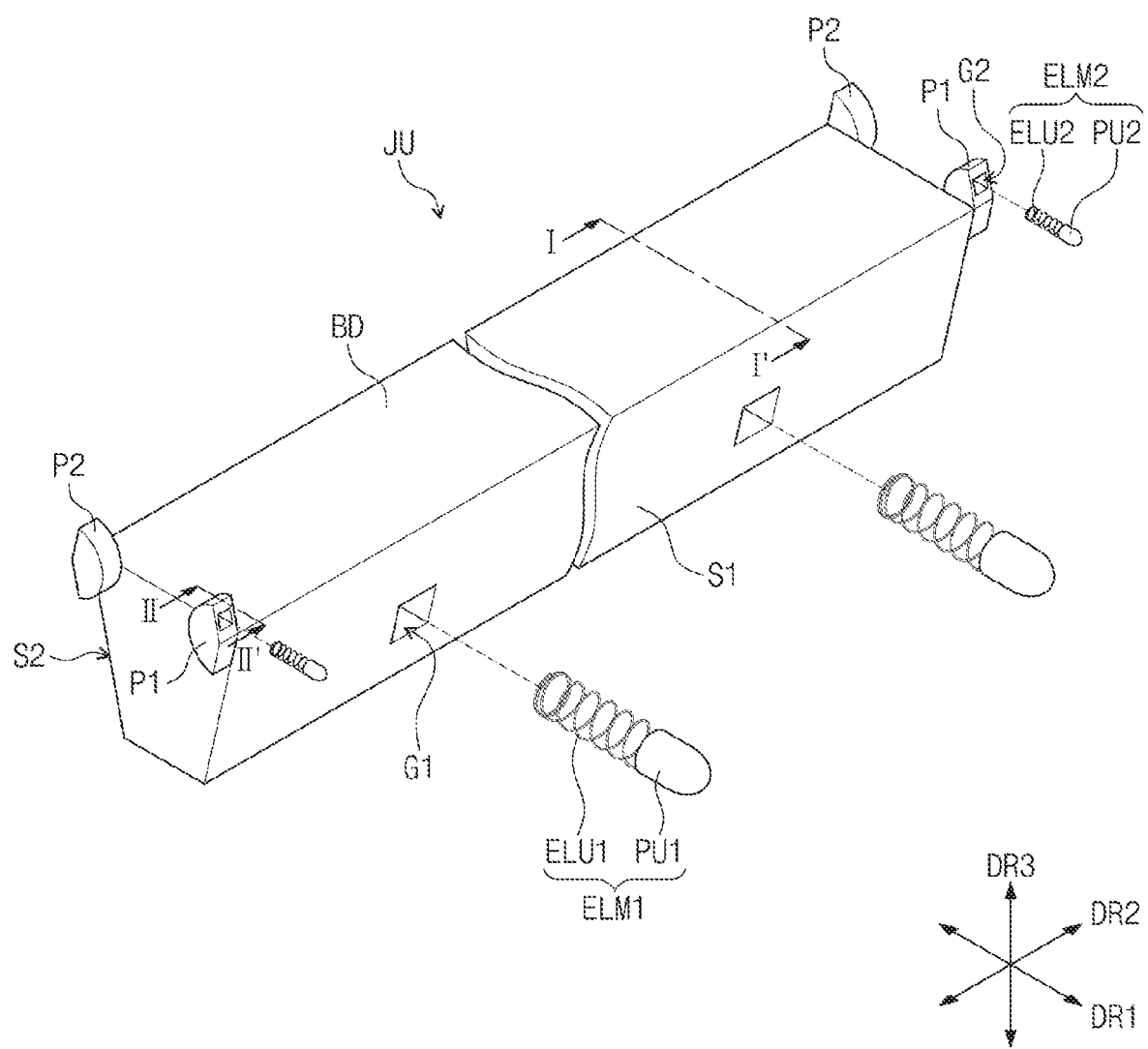
FIG. 7 is a perspective view illustrating a joint unit of the joint units in FIG. 6 according to some exemplary embodiments.
Figure 8:
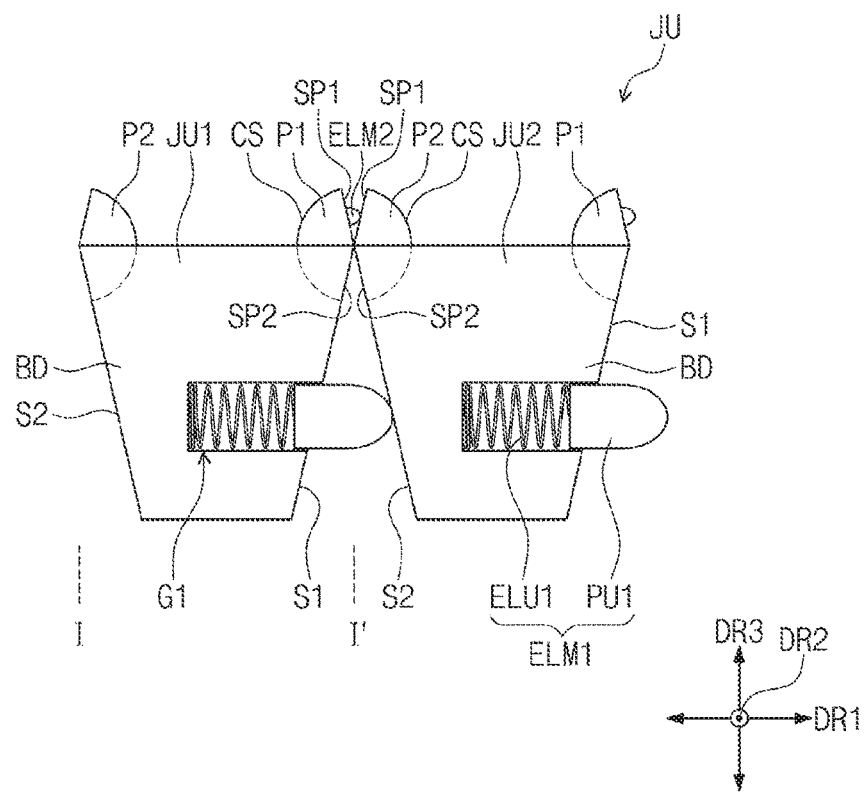
FIG. 8 is a cross-sectional view taken along sectional line I-I' of FIG. 7 according to some exemplary embodiments.
Figure 9:
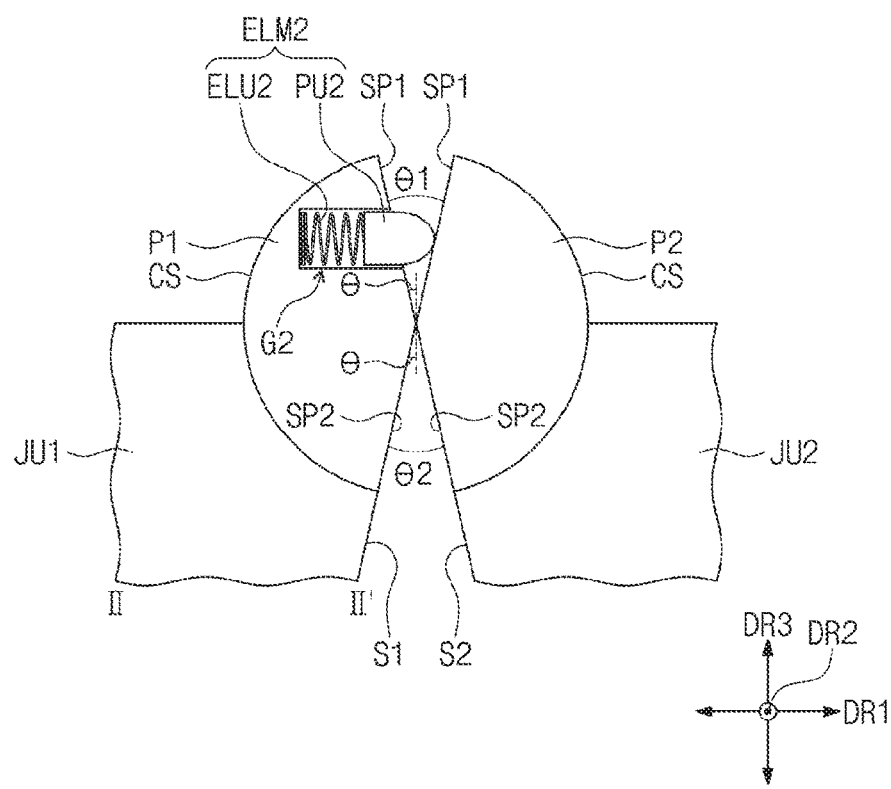
FIG. 9 is a cross-sectional view taken along sectional line II-II' of FIG. 7 according to some exemplary embodiments.
Figure 10:
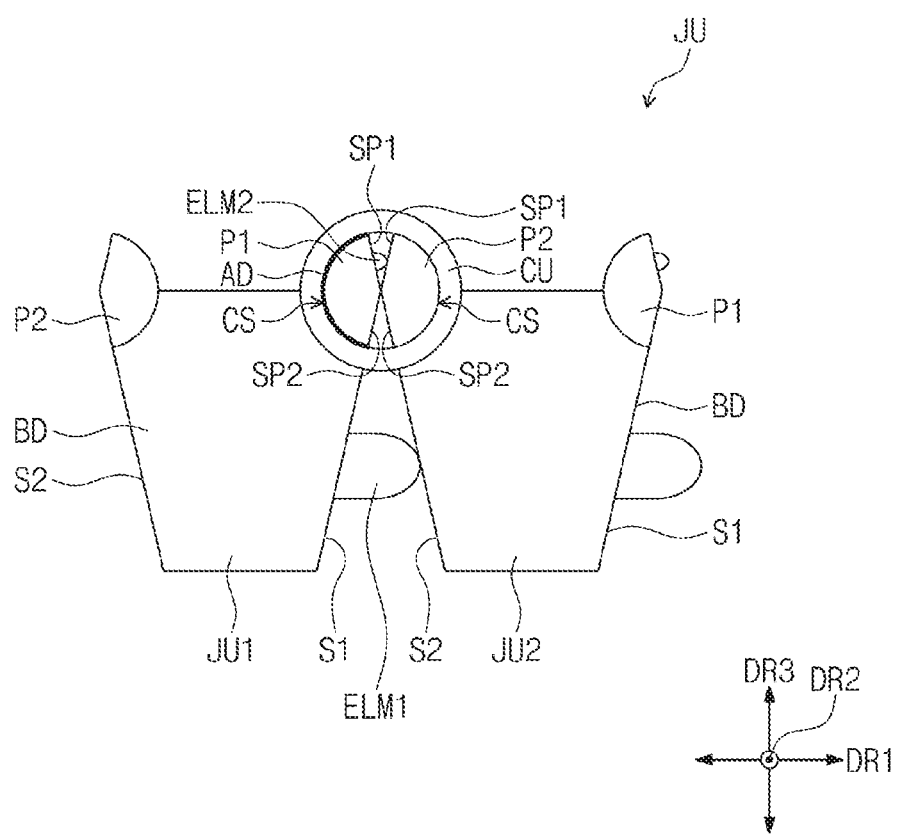
FIG. 10 is a view illustrating a state in which joint units adjacent to each other are connected according to some exemplary embodiments.

FIG. 7 is a perspective view illustrating a joint unit of the joint units in FIG. 6 according to some exemplary embodiments. FIG. 8 is a cross-sectional view taken along sectional line I-I' of FIG. 7 according to some exemplary embodiments. FIG. 9 is a cross-sectional view taken along sectional line II-II' of FIG. 7 according to some exemplary embodiments. FIG. 10 is a view illustrating a state in which joint units adjacent to each other are connected according to some exemplary embodiments.

For convenience of description, a cross-section of two joint units JU adjacent to each other is illustrated in FIGS. 8 and 9, and a side surface of two joint units JU adjacent to each other is illustrated in FIG. 10.

Referring to FIGS. 7 to 10, each of the joint units JU includes a body part BD extending in the second direction DR2 and a plurality of protruding parts P1 and P2 disposed at both sides of the body part BD when viewed from the first direction DR1. When viewed from the second direction DR2, the protruding parts P1 and P2 are disposed on both upper ends of the body part BD, respectively. Each of the protruding parts P1 and P2 may have a fan shape when viewed from the second direction DR2. When viewed from the second direction DR2, the body part BD may have a reverse trapezoidal shape.

The fan shape has an arc and two radii. The arc is defined as a portion of a circumference of a circle, and the radius is defined as a line connecting a center of a circle to one point on a circumference or a distance between a center of a circle and one point on a circumference.

Each of the protruding parts P1 and P2 includes a curved surface CS defined as an arc of the fan shape and a first inclined surface SP1 and a second inclined surface SP2, which are defined as two radii of the fan shape, respectively. The first inclined surface SP1 is disposed on the second inclined surface SP2. The curved surfaces CS of the protruding parts P1 and P2 disposed on the both upper ends of the body part BD.

An angle $\theta$ formed between the first inclined surface SP1 and the third direction DR3 is the same as an angle $\theta$ formed between the second inclined surface SP2 and the third direction DR3. Accordingly, a first angle $\theta 1$ formed between the first inclined surfaces SP1 of the joint units JU adjacent to each other may be the same as a second angle $\theta 2$ formed between the second inclined surfaces SP2 of the joint units adjacent to each other.

The protruding parts P1 and P2 disposed on the upper ends of the body part BD includes a first protruding part P1 disposed on one side of the both upper ends of the body part BD and a second protruding part P2 disposed on the other side of the both upper ends of the body part BD. The first protruding part P1 and the second protruding part P2 may have the same shape and may be symmetric to each other. For example, the curved surface CS of the first protruding part P1 and the curved surface CS of the second protruding part P2 face each other, and the first and second inclined surfaces SP1 and SP2 of the first protruding part P1 and the first and second inclined surfaces SP1 and SP2 of the second protruding part P2 face directions opposite to each other.

A vertex connecting the first inclined surface SP1 of the first protruding part P1 to the second inclined surface SP2 of the first protruding part P1 overlaps a vertex connecting the top surface of the body part BD to one side surface S1 of the body part BD. The second inclined surface SP2 of the first protruding part P1 overlaps the one side surface S1 of the body part BD. A vertex connecting the first inclined surface SP1 of the second protruding part P2 to the second inclined surface SP2 of the second protruding part P2 overlaps a vertex connecting the top surface of the body part BD to one side surface S1 of the body part BD. The second inclined surface SP2 of the second protruding part P2 overlaps the other side surface S2 of the body part BD.

Hereinafter, in FIGS. 8, 9, and 10, among the joint units JU adjacent to each other, the joint unit JU disposed at the left side is defined as a first joint unit JU1, and the joint unit JU disposed at the right side is defined as a second joint unit JU2.

A center point of the fan shape of the first protruding part P1 and a center point of the fan shape of the protruding part P2 that are disposed adjacent to each other among the first and second protruding parts P1 and P2 of the joint units JU, are disposed adjacent to each other. For example, the center point of the fan shape of the first protruding part P1 disposed on one side of the upper end of the first joint unit JU1 is disposed adjacent to the center point of the fan shape of the second protruding part P2 disposed on the other side of the upper end of the second joint unit JU2.

The center point of the fan shape of the first protruding part P2 is defined as a vertex connecting the first inclined surface SP1 of the first protruding part P1 to the second inclined surface SP2 of the first protruding part P1. The center point of the fan shape of the second protruding part P2 is defined as a vertex connecting the first inclined surface SP1 of the second protruding part P1 to the second inclined surface SP2 of the second protruding part P1.

The first protruding part P1 of the first joint unit JU1 and the second protruding part P2 of the second joint unit JU2, which is adjacent to the first protruding part P1 of the first joint unit JU1, are inserted into the corresponding connecting unit CU of the connecting units CU. The connecting unit CU has a ring shape, and an inside surface of the connecting unit CU contacts the curved surface CS of the first protruding part P1 of the first joint unit JU1 and the curved surface CS of the second protruding part P2 of the second joint unit JU2.

The curved surface CS of the first protruding part P1 of the first joint unit JU1 may be connected to the connecting unit CU. For example, as the curved surface CS of the first protruding part P1 of the first joint unit JU1 is attached to the inside surface of the connecting unit CU through an adhesion member AD, the first protruding part P1 of the first joint unit JU1 may be connected to the connecting unit CU. The second protruding part P2 may rotate along the inside surface of the connecting unit CU, and, resultantly, the first joint unit JU1 and the second joint unit JU2 may rotate with respect to a rotation shaft extending in the second direction DR2 at the center point of the ring shape of the connecting unit CU.

Although the configuration in which the first protruding part P1 is connected to the connecting unit CU through the adhesion member AD is exemplarily described, exemplary embodiments are not limited thereto. For example, the first protruding part P1 may be connected to the connecting unit CU through various connecting structures. Alternatively, the second protruding part P2 may be connected to the connecting unit CU instead of the first protruding part P1.

The support member 200 includes a plurality of first elastic members ELM1 and a plurality of second elastic members ELM2 that are disposed on the joint units JU. The first elastic members ELM1 are disposed in a plurality of first grooves G1 defined in one side surface S1 of the body part BD, respectively. A second groove G2 is defined in the first inclined surface SP1 of each of the first protruding parts P1, and each of the second elastic members ELM2 is disposed in the corresponding second groove G2 of the second grooves G2. Each of the first and second elastic members ELM1 and ELM2 extends in the first direction DR1.

Although two first elastic members EML1 are disposed on one body part BD, and one second elastic member ELM2 is disposed on one protruding part P1 as an example, exemplary embodiments are not limited to the number of the first and second elastic members ELM1 and ELM2.

Each of the first elastic members EML1 includes a first elastic unit ELU1 disposed in a corresponding first groove G1 of the first grooves G1 and a first push unit PU1 disposed on an end of the first elastic unit ELU1 and exposed to the outside through the corresponding first groove G1. The first push unit PU1 is disposed adjacent to the other side surface S2 of the body part BD of the joint unit JU adjacent to the first push unit PU1. For example, the first push unit PU1 of the first joint unit JU1 moves by the first elastic unit ELU1 in the first direction DR1 and is disposed adjacent to the other side surface S2 of the body part BD of the second joint unit JU2.

Each of the second elastic members EML2 includes a second elastic unit ELU2 disposed in a corresponding second groove G2 of the second grooves G2 and a second push unit PU2 disposed on an end of the second elastic unit ELU2 and exposed to the outside through the corresponding second groove G2. The second push unit PU2 is disposed adjacent to the first inclined surface SP1 of the second protruding part P2 of the joint unit JU adjacent to the second push unit PU2. For example, the second push unit PU2 of the first joint unit JU1 moves by the second elastic unit ELU2 in the first direction DR1 and is disposed adjacent to the first inclined surface SP1 of the second protruding part P2 of the second joint unit JU2.

The first push unit PU1 of the first joint unit JU1 serves to push the body part BD of the second joint unit JU2 by the first elastic unit ELU1. The second push unit PU2 of the second joint unit JU2 serves to push the protruding part P2 of the second joint unit JU2 by the second elastic unit ELU2.

Figure 11:
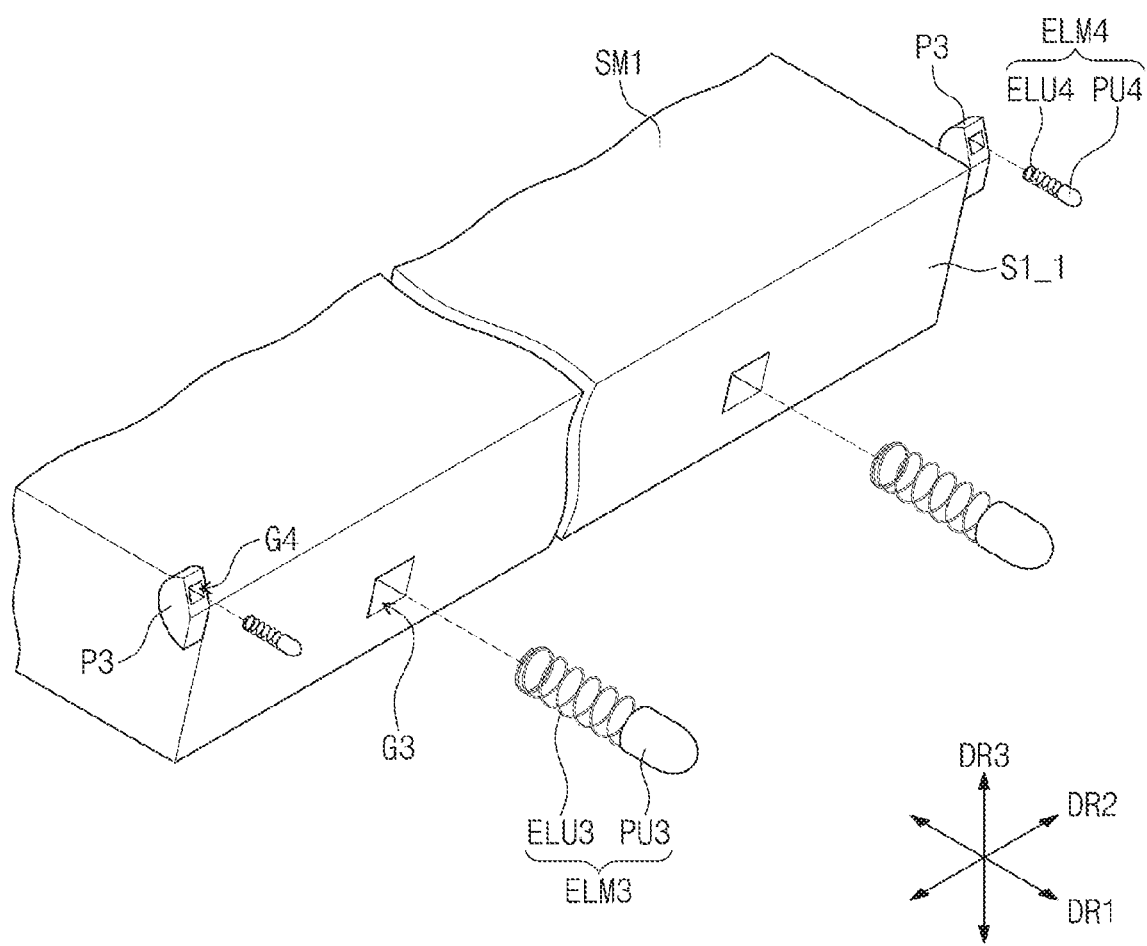
FIG. 11 is a view illustrating a structure of a side surface of a first support member in FIG. 6 according to some exemplary embodiments.
Figure 12:
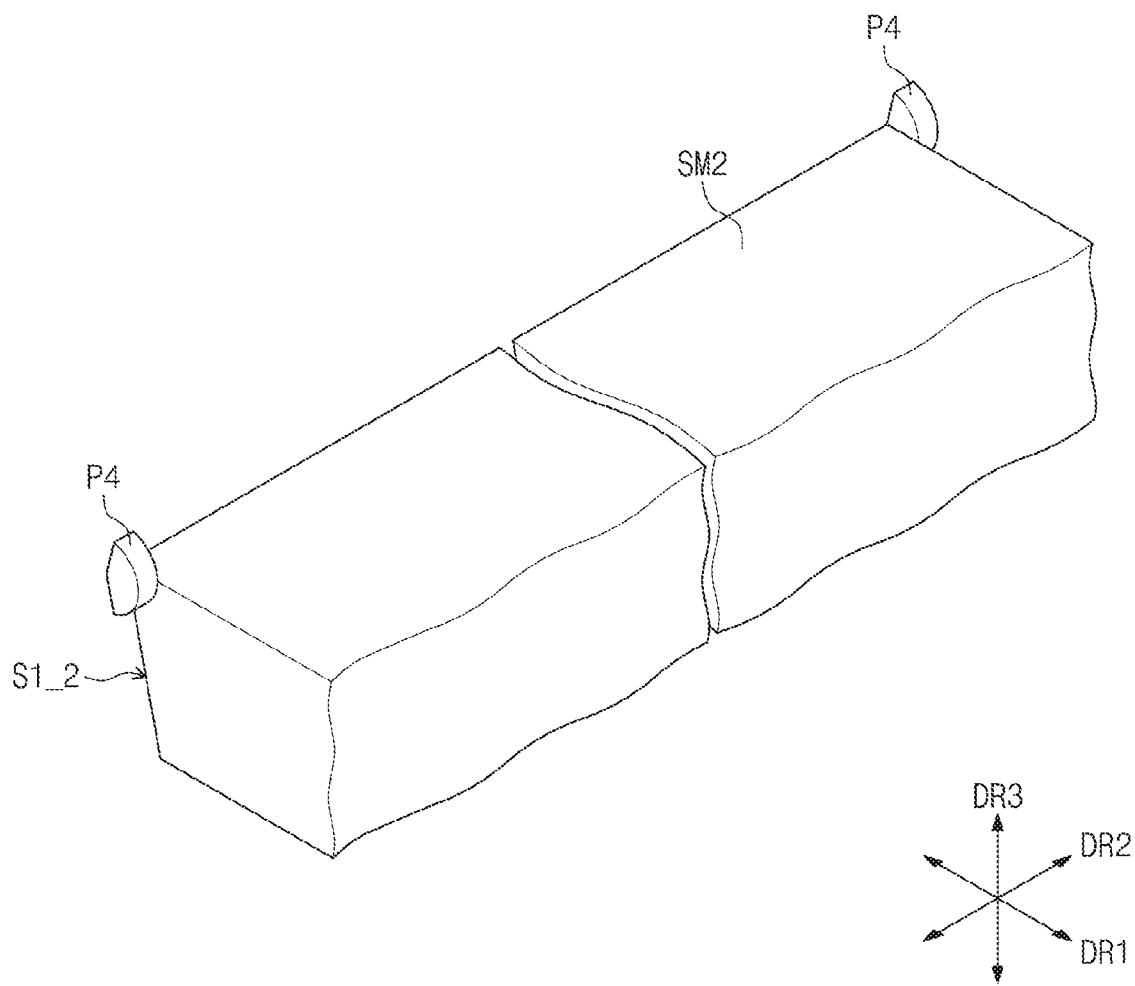
FIG. 12 is a view illustrating a structure of a side surface of a second support member in FIG. 6 according to some exemplary embodiments.

FIG. 11 is a view illustrating a structure of a side surface of a first support member in FIG. 6 according to some exemplary embodiments. FIG. 12 is a view illustrating a structure of a side surface of a second support member in FIG. 6 according to some exemplary embodiments.

Referring to FIGS. 11 and 12, one side surface S1_1 of the first support member SM1 faces one side surface S1_2 of the second support member SM2. The support member 200 includes a plurality of third and fourth protruding parts P3 and P4 disposed on the first and second support members SM1 and SM2, respectively, and a plurality of third and fourth elastic members ELM3 and ELM4.

When viewed from the first direction DR1, the plurality of third protruding parts P3 are disposed on both sides of the first support member SM1. One third protruding part P3 may be disposed on each of the both sides of the first support member SM1. When viewed from the second direction DR2, the third protruding part P3 is disposed on an upper end of one side of the first support member SM1. Each of the third protruding parts P3 may have the same shape as the first protruding part P1. The one side of the first support member SM1 corresponds to one side surface S1_1 of the first support member SM1.

When viewed from the first direction DR1, the plurality of fourth protruding parts P4 are disposed on both sides of the second support member SM2. One fourth protruding part P4 may be disposed on each of the both sides of the second support member SM2. When viewed from the second direction DR2, the fourth protruding part P4 is disposed on an upper end of one side of the second support member SM2. Each of the fourth protruding parts P4 may have the same shape as the second protruding part P2. The one side of the second support member SM2 corresponds to one side surface S1_2 of the second support member SM2. Accordingly, the one side of the first support member SM1 faces the one side of the second support member SM2.

The one side surface S1_1 of the first support member SM1 may be an inclined surface that is symmetric to the other side surface S2 of the body part BD of the joint unit JU adjacent to the first support member SM1. The one side surface S1_2 of the second support member SM2 may be an inclined surface that is symmetric to the one side surface S1 of the body part BD of the joint unit JU adjacent to the second support member SM2.

The plurality of third elastic members ELM3 are disposed in the plurality of third grooves G3 defined in the one side surface S1_1 of the first support member SM1. The fourth elastic member ELM4 is disposed in the fourth groove G4 defined in the first inclined surface SP1 of each of the third protruding parts P3. The third grooves G3 and the third elastic members ELM3 may have substantially the same structure as the first grooves G1 and the first elastic members ELM1. The fourth grooves G4 and the fourth elastic members ELM4 may have substantially the same structure as the second grooves G2 and the second elastic members ELM2.

Each of the third elastic members EML3 includes a third elastic unit ELU3 disposed in a corresponding third groove G3 of the third grooves G3 and a third push unit PU3 disposed on an end of the third elastic unit ELU3 and exposed to the outside through the corresponding third groove G3. The third push unit PU3 is disposed adjacent to the other side surface S2 of the body part BD of the joint unit JU adjacent to the third push unit PU3.

Each of the fourth elastic members EML4 includes a fourth elastic unit ELU4 disposed in a corresponding fourth groove G4 of the fourth grooves G4 and a fourth push unit PU4 disposed on an end of the fourth elastic unit ELU4 and exposed to the outside through the corresponding fourth groove G4. The fourth push unit PU4 is disposed adjacent to the one side surface S1 of the body part BD of the joint unit JU adjacent to the fourth push unit PU4.

Figure 13:
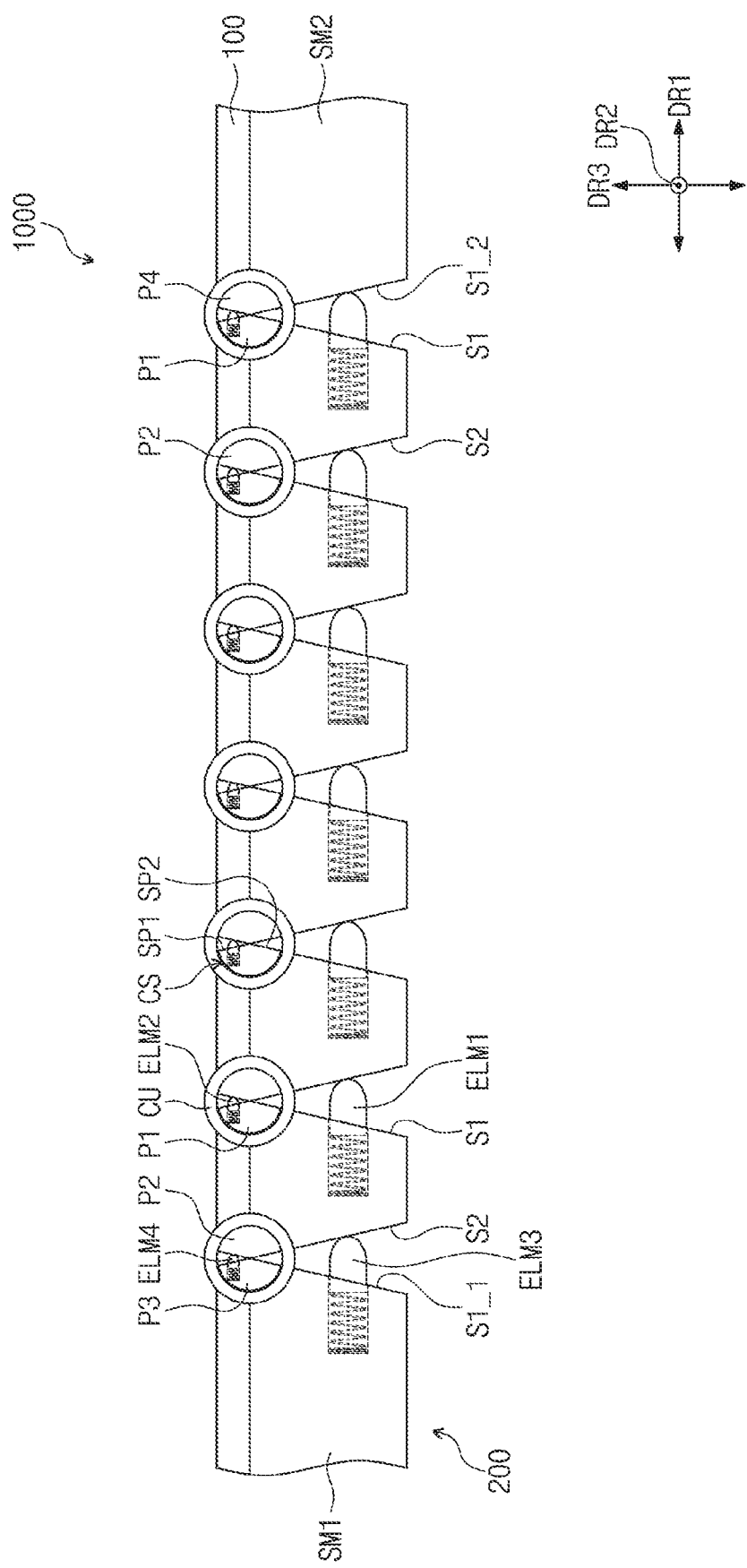
FIG. 13 is a side view illustrating a state in which first and second support members in FIG. 6 are connected to joint units according to some exemplary embodiments.

FIG. 13 is a side view illustrating a state in which first and second support members in FIG. 6 are connected to joint units according to some exemplary embodiments.

Referring to FIGS. 6 and 13, the folding area FA of the display module 100 are disposed on the body parts BD of the joint units JU, and the non-folding areas NFA of the display module 100 are disposed on the first and second support members SM1 and SM2, respectively. As described in FIG. 10, the joint units JU are connected to the connecting units CU to rotate each other. Although six joint units JU are exemplarily illustrated for convenience of description, exemplary embodiments are not limited to the number of the joint units JU disposed in the display apparatus 1000.

The third protruding part P3 of the first support member SM1 and the second protruding part P2 of the joint unit JU adjacent to the third protruding part P3 are inserted into a corresponding connecting unit CU of the connecting units CU. The fourth protruding part P4 of the second support member SM2 and the first protruding part P1 of the joint unit JU adjacent to the fourth protruding part P4 are inserted into a corresponding connecting unit CU of the connecting units CU.

Each of the structure in which the third protruding part P3 and the second protruding part P2 are connected to rotate each other and the structure in which the fourth protruding part P4 and the first protruding part P1 are connected to rotate each other is substantially the same as the structure in which the first protruding part P1 and the second protruding part P2 are connected to rotate each other in FIG. 10.

Figure 14:
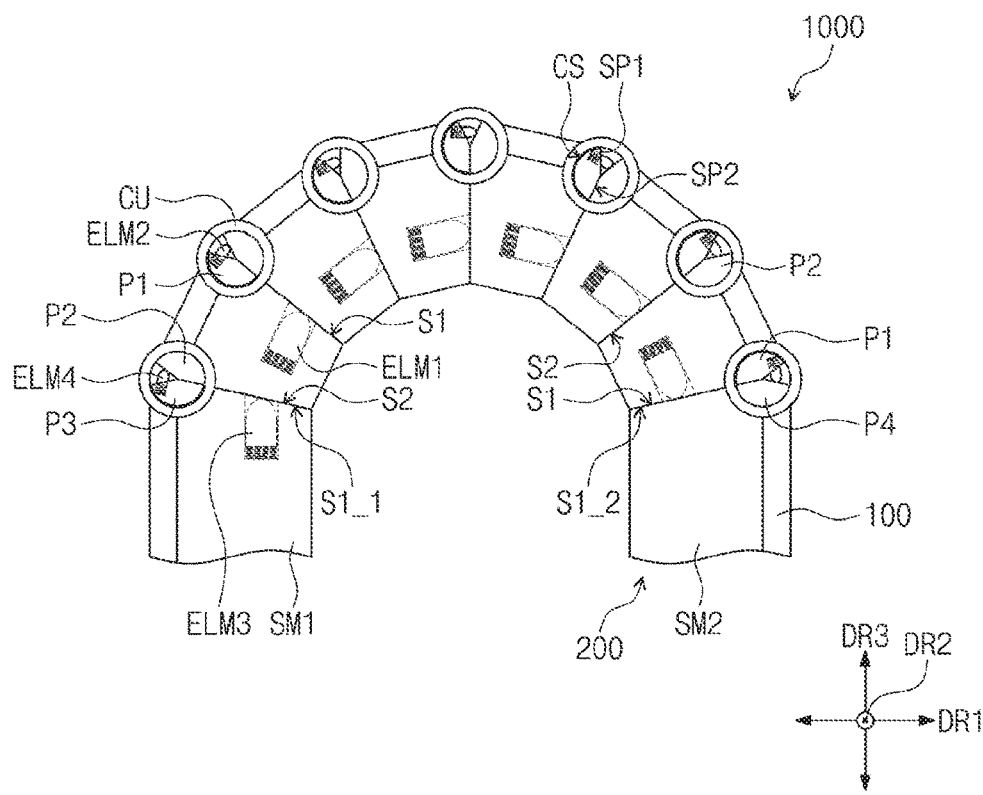
FIG. 14 is a view illustrating a state in which a display apparatus is out-folded according to some exemplary embodiments.
Figure 15:
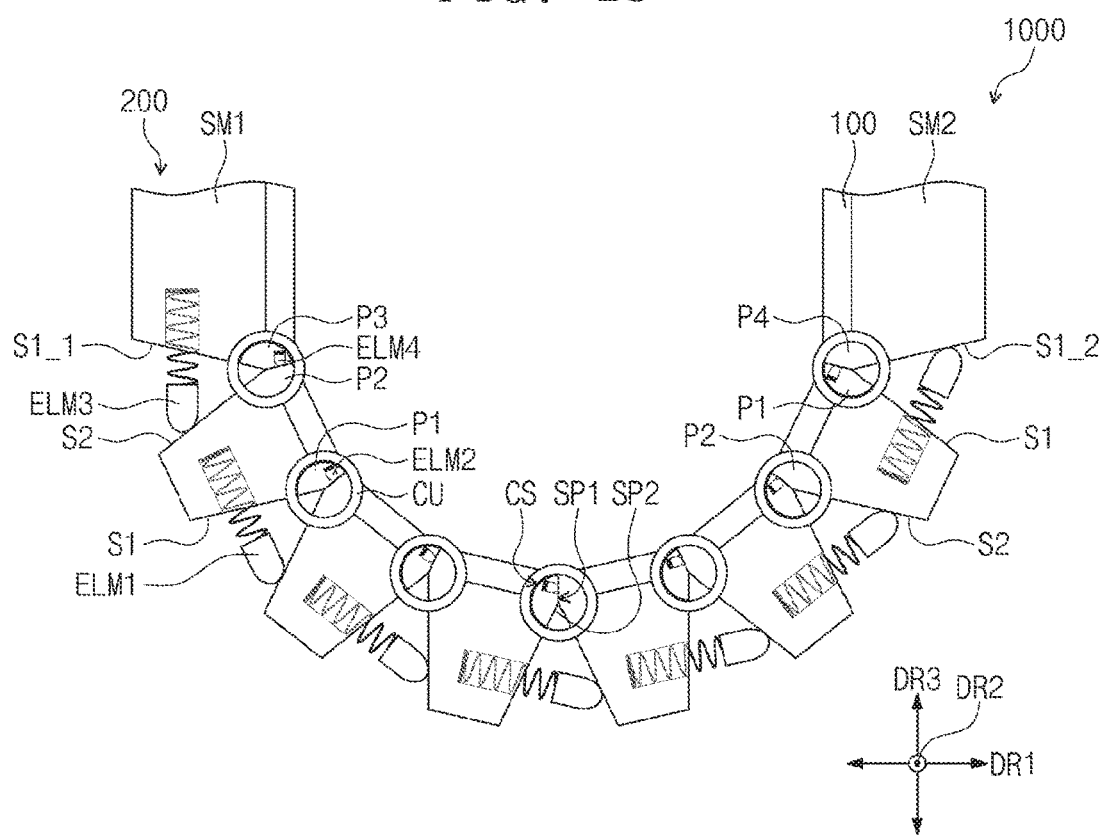
FIG. 15 is a view illustrating a state in which a display apparatus is in-folded according to some exemplary embodiments.

FIG. 14 is a view illustrating a state in which a display apparatus is out-folded according to some exemplary embodiments. FIG. 15 is a view illustrating a state in which a display apparatus is in-folded according to some exemplary embodiments.

Referring to FIG. 14, when the display apparatus 1000 is out-folded so that the joint units JU and the first and second support members SM1 and SM2 rotate to expose the display module 100 to the outside, the second inclined surfaces SP2 of the first, second, third, and fourth protruding parts P1, P2, P3, and P4 may contact each other, and the one side surfaces S1 and the other side surfaces S2 of the joint units JU may contact each other. Also, the one side surface S1_1 of the first support member SM1 and the other side surface S2 of the joint unit JU adjacent to the first support member SM1 may contact each other. Further, the one side surface S1_2 of the second support member SM2 and the one side surface S1 of the joint unit JU adjacent to the second support member SM1 may contact each other.

Referring to FIG. 15, when the display apparatus 1000 is in-folded so that the joint units JU and the first and second support members SM1 and SM2 rotate to prevent the display module 100 from being exposed to the outside, the first inclined surfaces SP1 of the first, second, third, and fourth protruding parts P1, P2, P3, and P4 may contact each other. As such, the display module 100 may be easily out-folded and in-folded. The display apparatus 1000 may be out-folded and in-folded by an external force.

In some exemplary embodiments, the first elastic members ELM1 push the body parts BD of the joint units JU adjacent thereto, the second elastic members ELM2 push the second protruding parts P2 of the joint units JU adjacent thereto, and the first and second elastic members ELM1 and ELM2 of the joint unit JU adjacent to the second support member SM2 push the second support member SM2 and the fourth protruding parts P4.

The third elastic members ELM3 push the body part of the joint unit JU adjacent thereto, and the fourth elastic members ELM4 push the second protruding parts P2 of the joint unit JU adjacent thereto. Accordingly, when the display apparatus 1000 does not receive the external force any more after being out-folded or in-folded by the external force, the display apparatus 1000 may be easily restored to the flat state again.

Resultantly, the display apparatus 1000 according to various exemplary embodiments may be easily in-folded and out-folded by the joint units JU, and the in-folded or out-folded display apparatus 1000 may be restored to the flat state again by the elastic members ELM1, EML2, ELM3, and EML4 disposed in the joint units JU.

Figure 16:
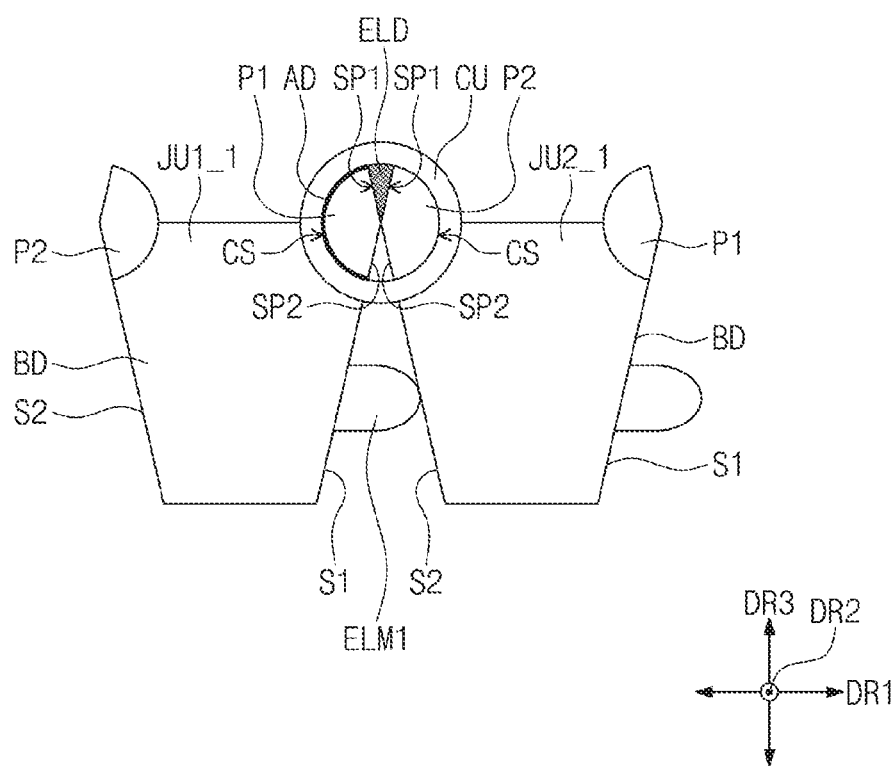
FIG. 16 is a view illustrating joint units used for the display apparatus in FIG. 6 according to some exemplary embodiments.

FIG. 16 is a view illustrating joint units used for the display apparatus in FIG. 6 according to some exemplary embodiments.

FIG. 16 illustrates a side surface corresponding to that in FIG. 10 for convenience of description. Hereinafter, components that are different from the first and second joint units JU1 and JU2 in FIG. 10 and of first and second joint units JU1_1 and JU2_1 in FIG. 16 will be mainly described, and the same components will be designated by the same reference symbols.

Referring to FIG. 16, the second elastic members ELM2 are not provided in the first and second joint units JU1_1 and JU2_1. Except for the second elastic members ELM2, other components of the first and second joint units JU1_1 and JU2_1 are the same as those of the first and second joint units JU1 and JU2 in FIG. 10.

An elastic body ELD is disposed between the first inclined surface SP1 of the first protruding part P1 of the first joint unit JU1_1 and the first inclined surface SP1 of the second protruding part P2 of the second joint unit JU1_2. The elastic body ELD may contain a material having determined elasticity. Although the elastic body ELD may include rubber as an example, exemplary embodiments are not limited thereto.

As the elastic body ELD having elasticity is disposed between the first inclined surface SP1 of the first protruding part P1 and the first inclined surface SP1 of the second protruding part P2, which are adjacent to each other, instead of the first elastic member ELM1, the display apparatus 1000 may be restored to the flat state again by the elastic body ELD after the display apparatus 1000 is in-folded.

Figure 17:
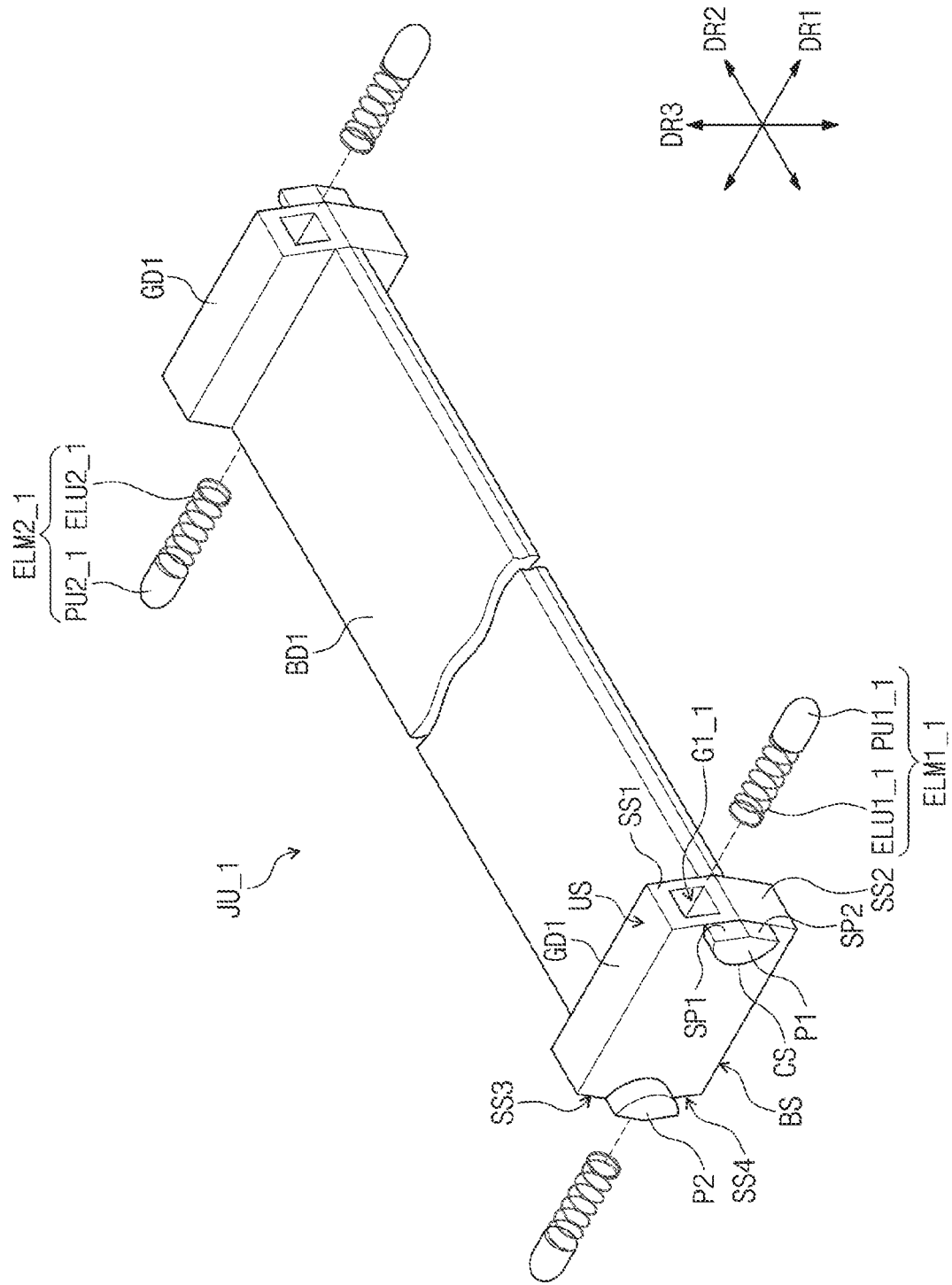
FIGS. 17 and 18 are views illustrating a joint unit of joint units of a display apparatus according to various exemplary embodiments.
Figure 18:
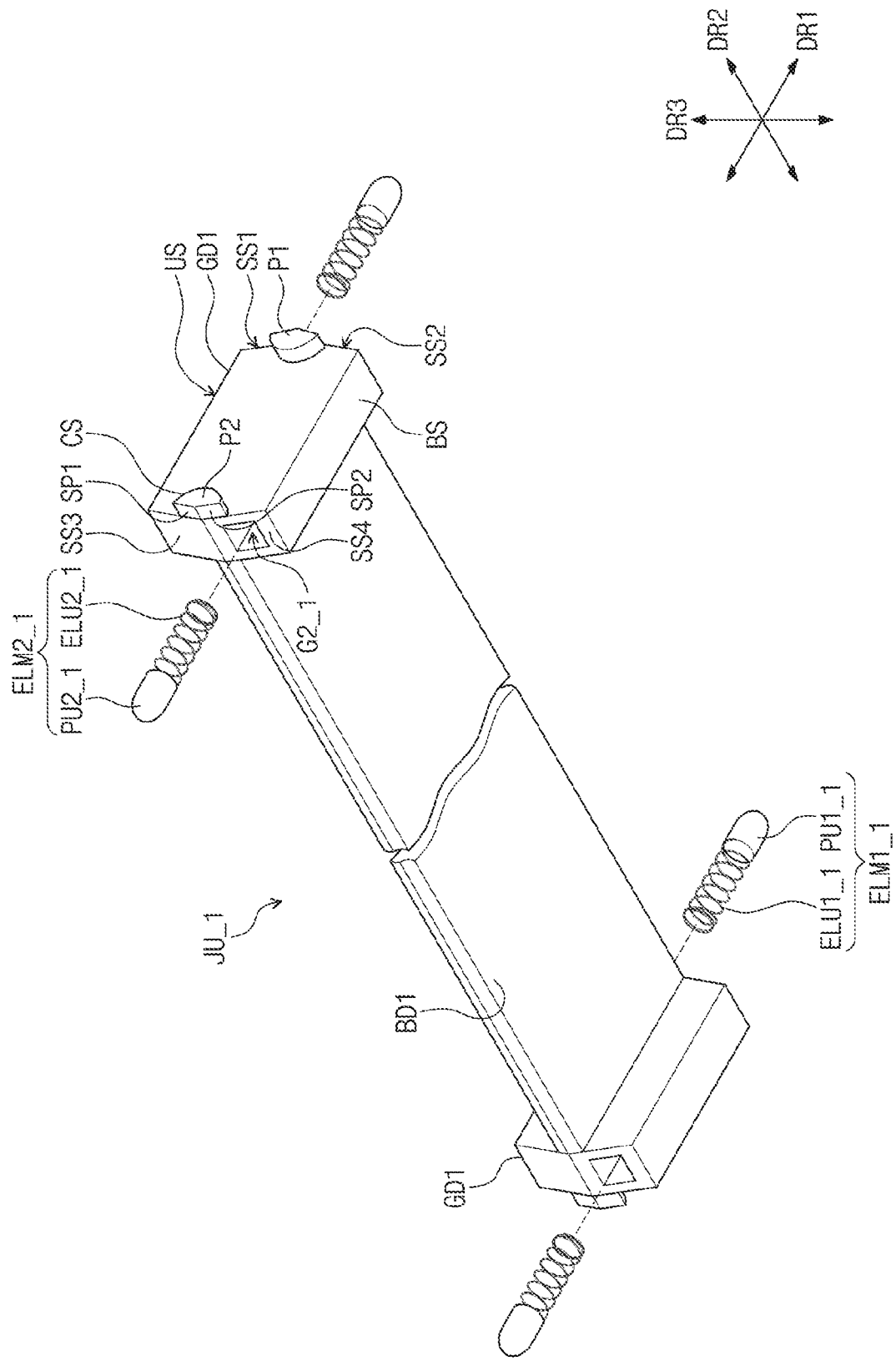
Figure 19:
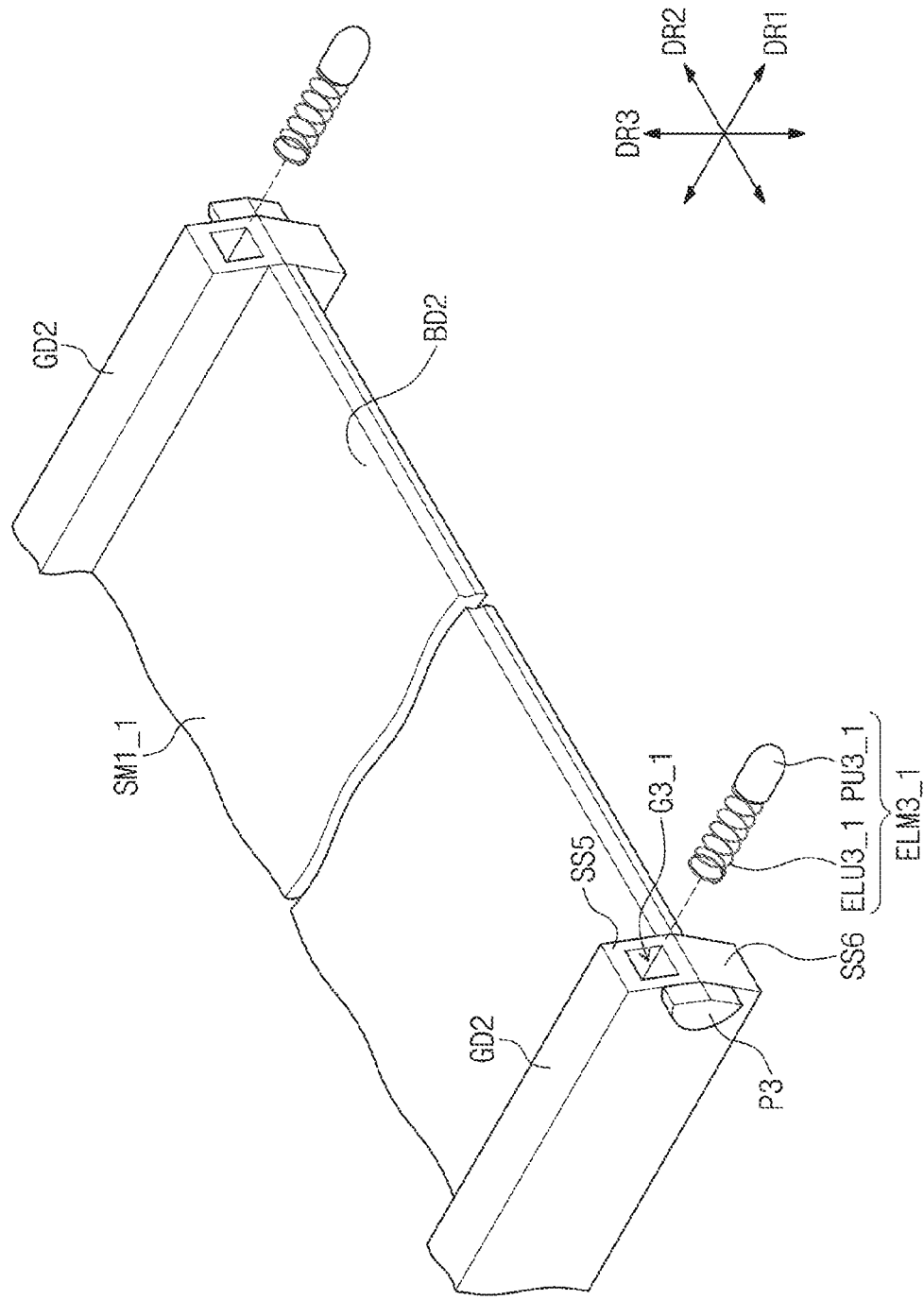
FIGS. 19 and 20 are views illustrating a first support member and a second support member according to various exemplary embodiments.
Figure 20:
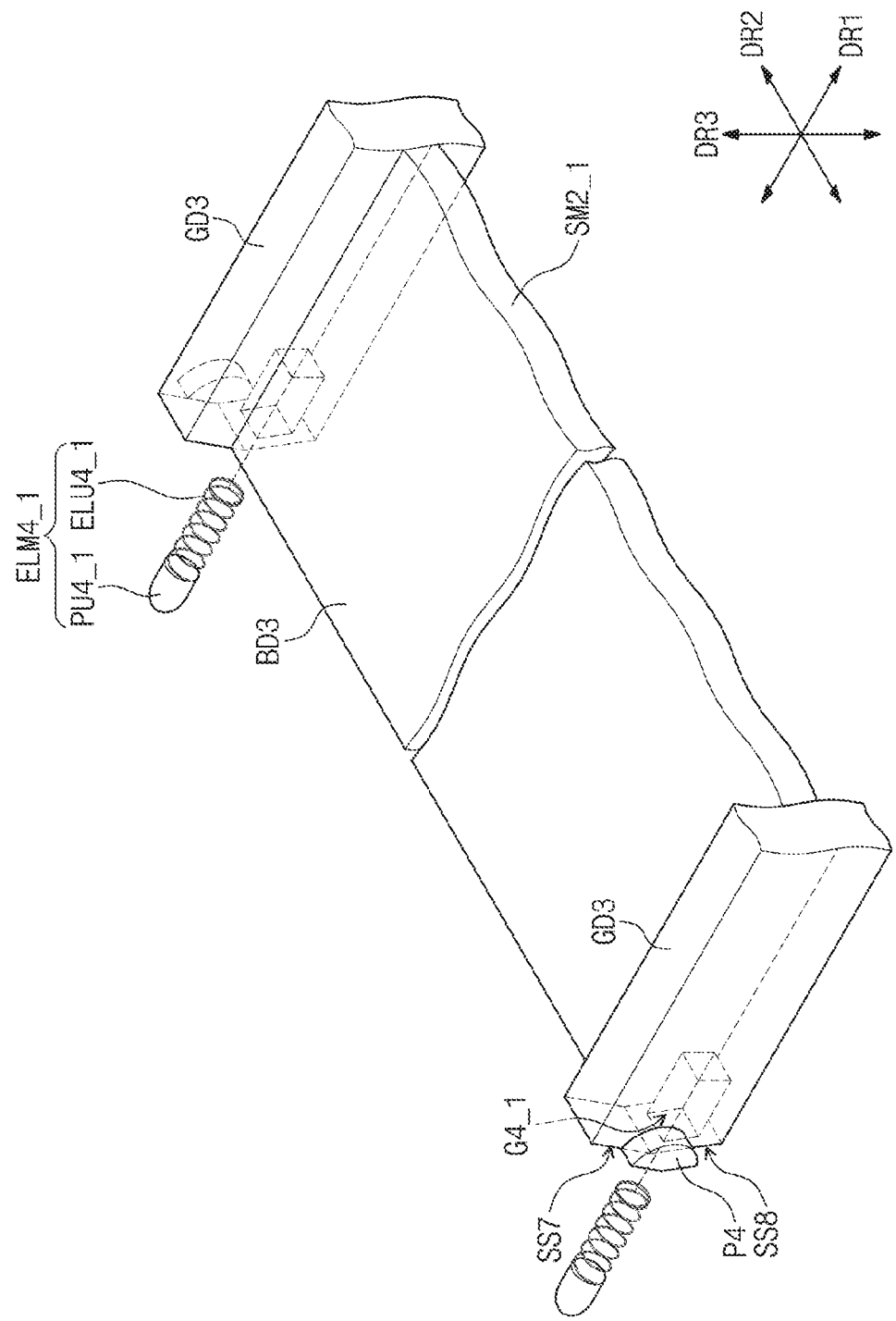

FIGS. 17 and 18 are views illustrating a joint unit of joint units of a display apparatus according to various exemplary embodiments. FIGS. 19 and 20 are views illustrating a first support member and a second support member according to various exemplary embodiments.

Although one joint unit JU_1 is illustrated for convenience of description in FIGS. 17 and 18, similar to FIG. 6, a plurality of joint units JU_1 may be provided as part of the display apparatus and may be disposed between the first support member SM1_1 and the second support member SM2_1 in FIGS. 19 and 20.

Hereinafter, components of the joint units JU_1 and the first and second support members SM1_1 and SM2_1, which are different from those of the joint units JU and the first and second support members SM1 and SM2 of the display apparatus 1000, will be mainly described, and the same components will be designated by the same reference symbols.

Referring to FIGS. 17 and 18, the joint units JU_1 includes a first body part BD1 extending in the first direction DR1, first guide parts GD1 disposed on both sides of the first body part BD1 when viewed from the first direction DR1, and a plurality of protruding parts P1 and P2 disposed on both sides of the first guide parts GD1 when viewed from the second direction DR2.

Two protruding parts are disposed on both side of each of the first guide parts GD1, respectively. The first protruding part P1 is disposed on one side of the both sides of each of the first guide parts GD1, and the second protruding part P2 is disposed on the other side of the both sides of each of the first guide parts GD1. The first protruding parts P1 have the same configuration as the first protruding parts P1 in FIG. 7, and the second protruding parts P2 have the same configuration as the second protruding parts P2 in FIG. 7. Thus, description regarding the first and second protruding parts P1 and P2 will be omitted.

The first body part BD1 may have a plane in parallel with the first direction DR1 and the second direction DR2. The folding area FA of the display module 100 is disposed on the first body parts BD1 of the joint units JU_1. When viewed from the second direction DR2, each of the guide parts GD1 may have a hexagonal shape. In the third direction DR3, each of the first guide parts GD1 may have a thickness greater than that of the first body part BD1. The first and second protruding parts P1 and P2 are disposed on outer surfaces of the first guide parts GD1, which are opposite to inner surfaces, which face each other, of the first guide parts GD1.

Each of the first guide parts GD1 includes a top surface US, a bottom surface BS, a first side surface SS1, a second side surface SS2, a third side surface SS3, and a fourth side surface SS4. The top surface US extends in the first direction DR1, is parallel to the first body part BD1, and is disposed higher than the first body part BD1. The bottom surface BS extends in the first direction DR1, is parallel to the first body part BD1, overlaps the top surface US, and is disposed lower than the first body part BD1.

When viewed from the second direction DR2, the first side surface SS1 is connected to one side of the top surface US. When viewed from the second direction DR2, the second side surface SS2 is connected to one side of the bottom surface BS, which is disposed below one side of the top surface US, and an end of the first side surface SS1. When viewed from the second direction DR2, the third side surface SS3 is connected to the other side of the top surface US, which is the opposite side of the one side of the top surface US. When viewed from the second direction DR2, the fourth side surface SS4 is connected to the other side of the bottom surface BS, which is the opposite side of the one side of the bottom surface BS, and an end of the third side surface SS3.

Each of an angle between the first side surface SS1 and the second side surface SS2 and an angle between the third side surface SS3 and the fourth side surface SS4 is less than about 180°. A vertex connecting the first inclined surface SP1 to the second inclined surface SP2 of each of the first protruding parts P1 overlaps a vertex connecting the first side surface SS1 to the second side surface SS2 of each of the first guide parts GD1. A vertex connecting the first inclined surface SP1 to the second inclined surface SP2 of each of the second protruding parts P2 overlaps a vertex connecting the third side surface SS3 to the fourth side surface SS4 of each of the first guide parts GD1.

The first inclined surface SP1 of each of the first protruding parts P1 is parallel to the first side surface SS1 of each of the first guide parts GD1, and the second inclined surface SP2 of each of the first protruding parts P1 is parallel to the second side surface SS2 of each of the first guide parts GD1. The first inclined surface SP1 of each of the second protruding parts P2 is parallel to the third side surface SS3 of each of the first guide parts GD1, and the second inclined surface SP2 of each of the second protruding parts P2 is parallel to the fourth side surface SS4 of each of the first guide parts GD1.

A plurality of first elastic members ELM1_1 are disposed in a plurality of first grooves G1_1 defined in the first side surfaces SS1, respectively, and a plurality of second elastic members ELM2_1 are disposed in a plurality of second grooves G2_1 defined in the fourth side surfaces SS4, respectively. One first elastic member ELM1_1 is disposed in the first groove G1_1 defined in the first side surface SS1 of each of the first guide parts GD1, and one second elastic member ELM2_1 is disposed in the second groove G2_1 defined in the fourth side surface SS4 of each of the first guide parts GD1.

Each of the first and second elastic members ELM1_1 and ELM2_1 extends in the first direction DR1. The first elastic members ELM1_1 may have substantially the same configuration as the second elastic members ELM2_1 except that the disposed directions thereof are opposite to each other.

Each of the first elastic members EML1_1 includes a first elastic unit ELU1_1 disposed in a corresponding first groove G1_1 of the first grooves G1_1 and a first push unit PU1_1 disposed on an end of the first elastic unit ELU1_1 and exposed to the outside through the corresponding first groove G1_1. The first push unit PU1_1 is disposed adjacent to the third side surfaces SS3 of the first guide parts GD1 of the joint unit JU_1 adjacent to the first push units PU1_1.

Each of the second elastic members EML2_1 includes a second elastic unit ELU2_1 disposed in a corresponding second groove G2_1 of the second grooves G2_1 and a second push unit PU2_1 disposed on an end of the second elastic unit ELU2_1 and exposed to the outside through the corresponding second groove G2_1. The second push unit PU1_1 is disposed adjacent to the second side surfaces SS2 of the first guide parts GD1 of the joint unit JU_1 adjacent to the second push units PU2_1.

Referring to FIGS. 19 and 20, the first support member SM1_1 includes a second body part BD2, a plurality of second guide parts GD2, a plurality of third protruding parts P3, and a plurality of third elastic members ELM3_1. The second support member SM2_1 includes a third body part BD3, a plurality of third guide parts GD3, a plurality of fourth protruding parts P4, and a plurality of fourth elastic members ELM4_1. Each of the second and third body parts BD2 and BD3 has a plane in parallel with the first and second directions DR1 and DR2, and the non-folding areas NFA of the display module 100 are disposed on the second and third body parts BD2 and BD3, respectively.

When viewed from the first direction DR1, the second guide parts GD2 are disposed on both sides of the second body part BD2, respectively, and extend in the first direction DR1. When viewed from the second direction DR2, each of the third protruding parts P3 has the same shape as each of the first protruding parts P1 and is disposed on one side of each of the second guide parts GD2.

When viewed from the first direction DR1, the third guide parts GD2 are disposed on both sides of the second body part BD2, respectively, and extend in the first direction DR1. When viewed from the second direction DR2, each of the fourth protruding parts P4 has the same shape as each of the second protruding parts P2 and is disposed on one side of each of the third guide parts GD3. The one side of each of the second guide parts GD2 faces the one side of each of the third guide parts GD3.

One side surface of each of the second guide parts GD2 includes a fifth side surface SS5 that is symmetric to the third side surface SS3 and a sixth side surface SS6 that is symmetric to the fourth side surface SS4. One side surface of each of the third guide parts GD3, which faces the one side surface of each of the second guide parts GD2, includes a seventh side surface SS7 that is symmetric to the first side surface SS1 and a eighth side surface SS8 that is symmetric to the second side surface SS2.

A third groove G3_1 is defined in each of the fifth side surfaces SS5, and a third elastic member ELM3_1 corresponding to the third groove G3_1 is disposed in the third groove G3_1. Each of the third elastic members EML3_1 includes a third elastic unit ELU3_1 disposed in a corresponding third groove G3_1 of the third grooves G3_1 and a third push unit PU3_1 disposed on an end of the third elastic unit ELU3_1 and exposed to the outside through the corresponding third groove G3_1.

A fourth groove G4_1 is defined in each of the eighth side surfaces SS8, and a fourth elastic member ELM4_1 corresponding to the fourth groove G4_1 is disposed in the fourth groove G4_1. Each of the fourth elastic members EML4_1 includes a fourth elastic unit ELU4_1 disposed in a corresponding fourth groove G4_1 of the fourth grooves G4_1 and a fourth push unit PU4_1 disposed on an end of the fourth elastic unit ELU4_1 and exposed to the outside through the corresponding fourth groove G4_1.

The third push unit PU3_1 is disposed adjacent to the third side surfaces SS3 of the first guide parts GD1 of the joint unit JU_1 adjacent to the third push units PU3_1. The fourth push unit PU4_1 is disposed adjacent to the second side surfaces SS2 of the first guide parts GD1 of the joint unit JU_1 adjacent to the fourth push units PU4_1.

Figure 21:
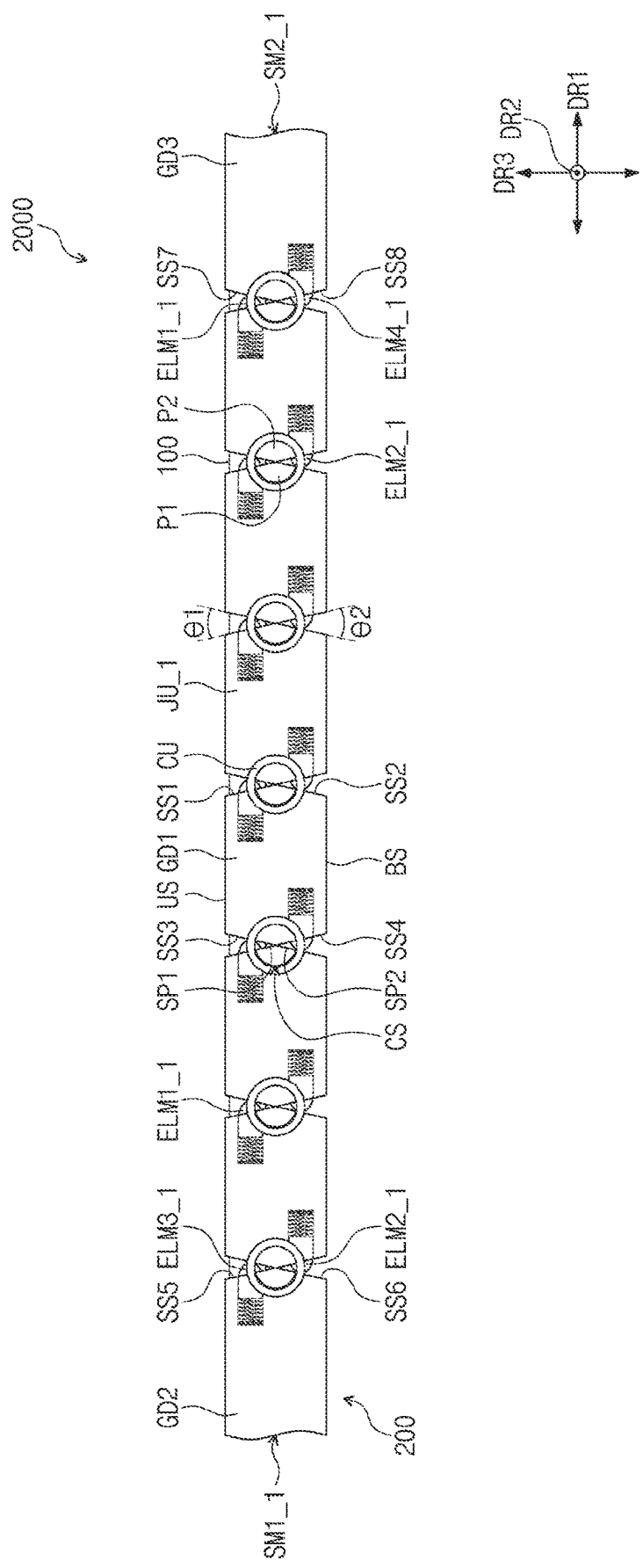
FIG. 21 is a side view illustrating a state in which the first and second support members and the joint units in FIGS. 17 to 20 are connected to each other according to some exemplary embodiments.
Figure 22:
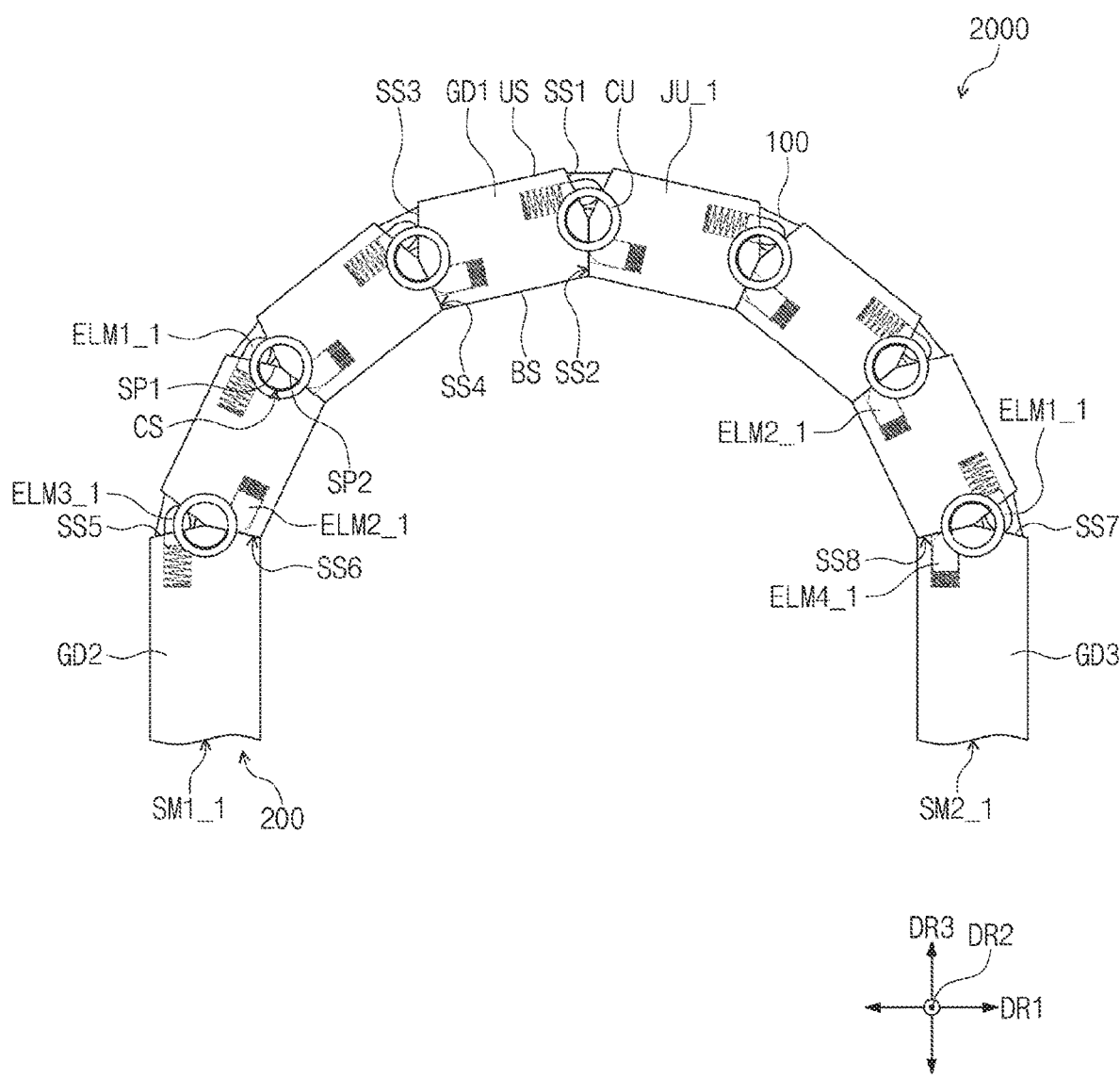
FIG. 22 is a view illustrating a state in which a display apparatus in FIG. 21 is out-folded according to some exemplary embodiments.
Figure 23:
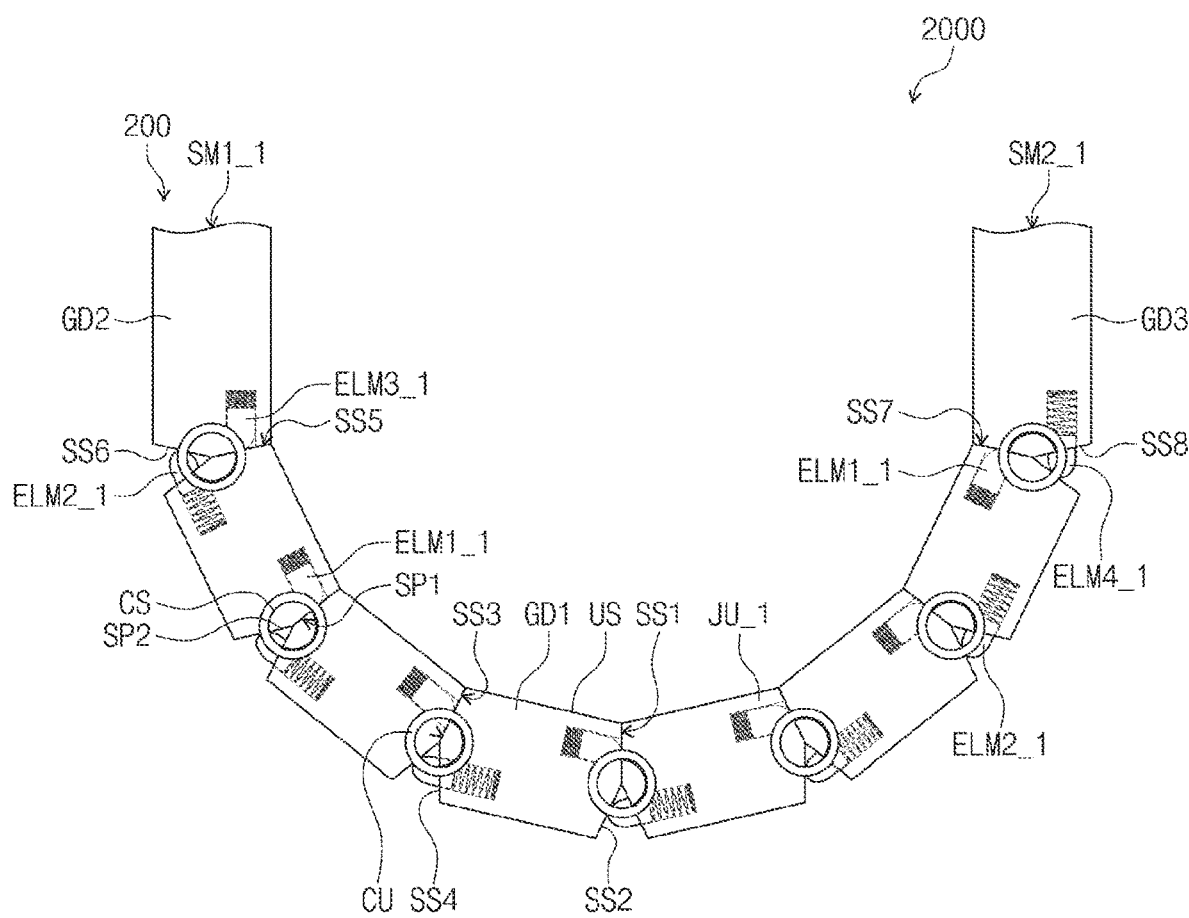
FIG. 23 is a view illustrating a state in which the display apparatus in FIG. 21 is in-folded according to some exemplary embodiments.

FIG. 21 is a side view illustrating a state in which the first and second support members and the joint units in FIGS. 17 to 20 are connected to each other according to some exemplary embodiments. FIG. 22 is a view illustrating a state in which a display apparatus in FIG. 21 is out-folded according to some exemplary embodiments. FIG. 23 is a view illustrating a state in which the display apparatus in FIG. 21 is in-folded according to some exemplary embodiments.

Referring to FIG. 21, a configuration in which the first support member SM1_1, the second support member SM2_1, and the joint units JU_1 are coupled to rotate each other by the connecting units CU is substantially the same as the configuration in which the first and second support members SM1 and SM2 and the joint units JU are coupled to rotate each other by the connecting units CU in FIG. 13.

A first angle $\theta 1$ between the first side surface SS1 and the third side surface SS3 of the first guide parts GD1 adjacent to each other and a second angle $\theta 2$ between the second side surface SS2 and the fourth side surface SS4 of the first guide parts GD1 adjacent to each other are the same as each other. Accordingly, an angle formed between the first side surface SS1 and the third direction DR3 may be the same as an angle formed between the second side surface SS2 and the third direction DR3.

Referring to FIG. 22, when the joint units JU_1 and the first and second support members SM1_1 and SM2_1 rotate to allow a display apparatus 2000 to be out-folded, the second side surface SS2 and the fourth side surface SS4 of the first guide parts GD1, of which the second inclined surfaces SP2 contact each other and that are adjacent to each other, may contact each other. Also, the sixth side surface SS6 of the first support member SM1_1 may contact the fourth side surface SS4 of the joint unit SU_1 adjacent to the first support member SM1_1, and the eighth side surface SS8 of the second support member SM2_1 may contact the second side surface SS2 of the joint unit SU_1 adjacent to the second support member SM2_1.

Referring to FIG. 23, when the joint units JU_1 and the first and second support members SM1_1 and SM2_1 rotate to allow the display apparatus 2000 to be in-folded, the first side surface SS1 and the third side surface SS3 of the first guide parts GD1, of which the first inclined surfaces SP1 contact each other and that are adjacent to each other, may contact each other. Also, the fifth side surface SS5 of the first support member SM1_1 may contact the third side surface SS3 of the joint unit SU_1 adjacent to the first support member SM1_1, and the seventh side surface SS7 of the second support member SM2_1 may contact the first side surface SS1 of the joint unit SU_1 adjacent to the second support member SM2_1.

In some exemplary embodiments, the first elastic members ELM1_1 push the third side surfaces SS3 of the first guide parts GD1 adjacent thereto, and the second elastic members ELM2_1 push the second side surfaces SS2 of the first guide parts GD1 adjacent thereto. The second elastic members ELM2_1 of the first guide part GD1 adjacent to the first support member SM1_1 push the sixth side surfaces SS6 of the second guide part GD2, and the first elastic members ELM1_1 of the first guide part GD1 adjacent to the second support member SM2_1 push the seventh side surfaces SS7 of the third guide part GD3. The third elastic members ELM3_1 push the third side surfaces SS3 of the first guide parts GD1 adjacent thereto, and the fourth elastic members ELM4_1 push the second side surfaces SS2 of the first guide parts GD1 adjacent thereto.

Resultantly, the display apparatus 2000 according to various exemplary embodiments may be easily in-folded and out-folded by the joint units JU_1, and the in-folded or out-folded display apparatus 2000 may be restored to the flat state again by the elastic members ELM1_1, EML2_1, ELM3_1, and EML4_1 disposed in the joint units JU_1.

Figure 24:
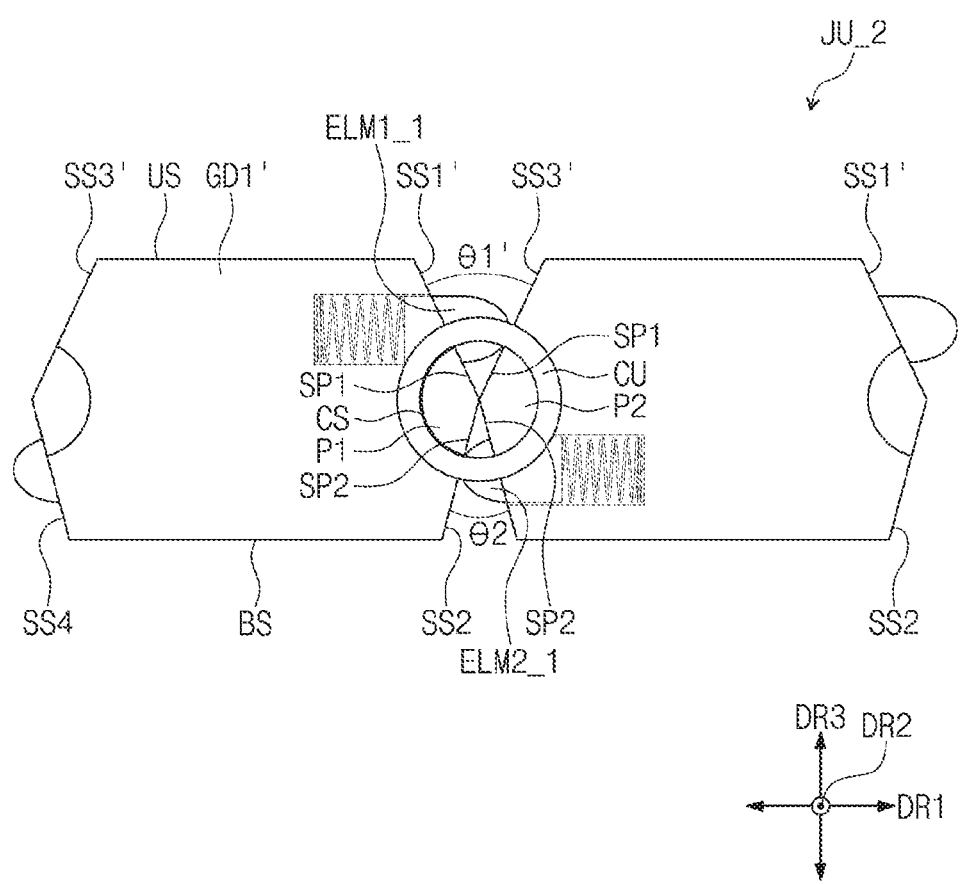
FIG. 24 is a view illustrating two joint units adjacent to each other among joint units of a display apparatus according to some exemplary embodiments.
Figure 25:
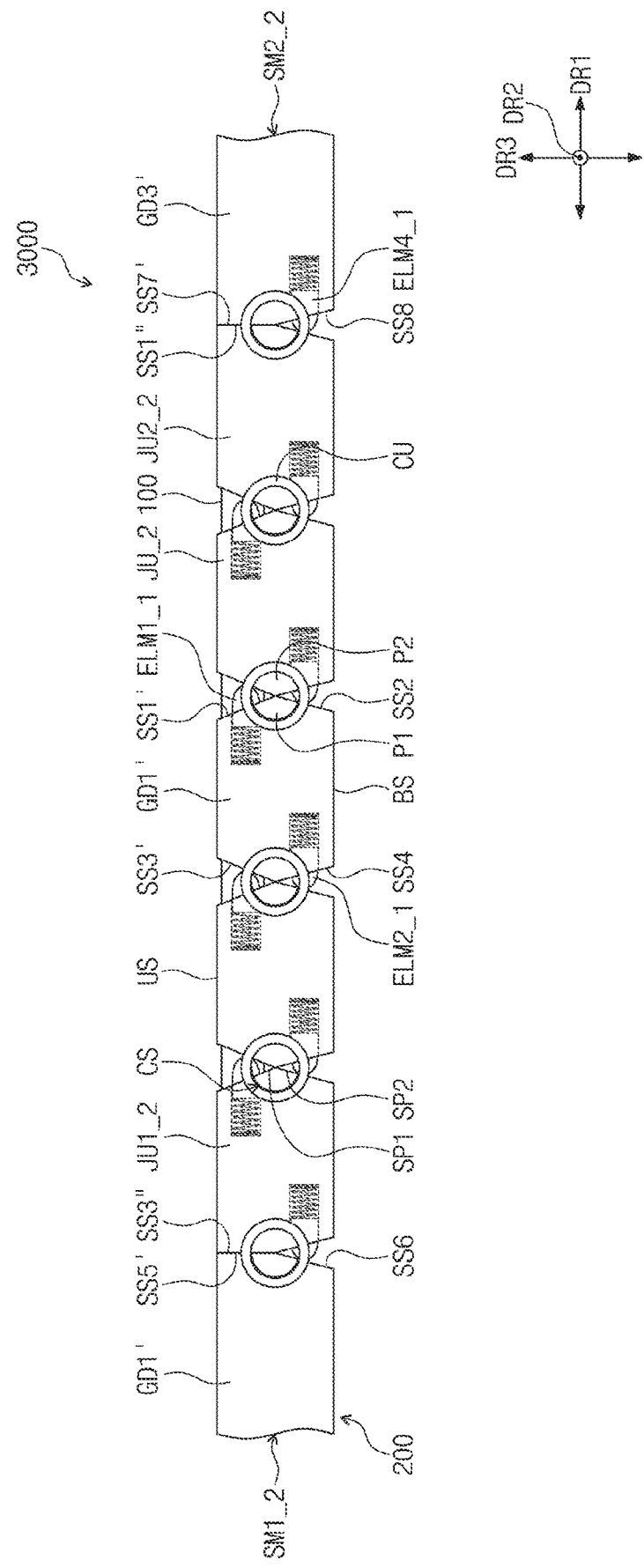
FIG. 25 is a side view illustrating a configuration of a display apparatus according to some exemplary embodiments.

FIG. 24 is a view illustrating two joint units adjacent to each other among joint units of a display apparatus according to some exemplary embodiments. FIG. 25 is a side view illustrating a configuration of a display apparatus according to some exemplary embodiments.

A configuration of a display apparatus 3000 is the same as that of the display apparatus 2000 in FIG. 21, except for a configuration of first and third side surfaces SS1', SS1", SS3', and SS3" of joint units JU_2 and fifth and seventh side surfaces SS5' and SS7' of first and second support members SM1_2 and SM2_2. Accordingly, hereinafter, components of the display apparatus 3000, especially components of the first and third side surfaces SS1', SS1", SS3', and SS3" of the joint units JU_2 and the fifth and seventh side surfaces SS5' and SS7' of first and second support members SM1_2 and SM2_2, will be mainly described, and the same components will be designated by the same reference symbols.

Referring to FIG. 24, a first angle θ1' between the first side surface SS1' and the third side surface SS3' of the joint units JU_2 adjacent to each other is greater than a second angle θ2 between the second side surface SS2 and the fourth side surface SS4 of the joint units JU_2 adjacent to each other.

Referring to FIG. 25, a third side surface SS3" of each of first guide parts GD1' of a joint unit JU1_2 adjacent to a first support member SM1_2 among joint units JU_2 and a fifth side surface SS5' of the first support member SM1_2 are in parallel to each other in the third direction DR3. A first side surface SS1" of each of the first guide parts GD1' of a joint unit JU2_2 adjacent to a second support member SM2_2 among the joint units JU_2 and a seventh side surface SS7' of the second support member SM2_2 are in parallel to each other in the third direction DR3.

When the joint units JU_2 and the first and second support members SM1_2 and SM2_2 are arranged in a flat manner, the third side surface SS3" of the joint unit JU1_2 and the fifth side surface SS5' of the first support member SM1_2 may contact each other. Also, the first side surface SS1" of the joint unit JU2_2 and the seventh side surface SS7' of the second support member SM2_2 may contact each other.

Although five joint units JU_2 are exemplarily illustrated for convenience of description, exemplary embodiments are not limited to the number of the joint units JU_2 disposed as part of the display apparatus 3000.

Figure 26:
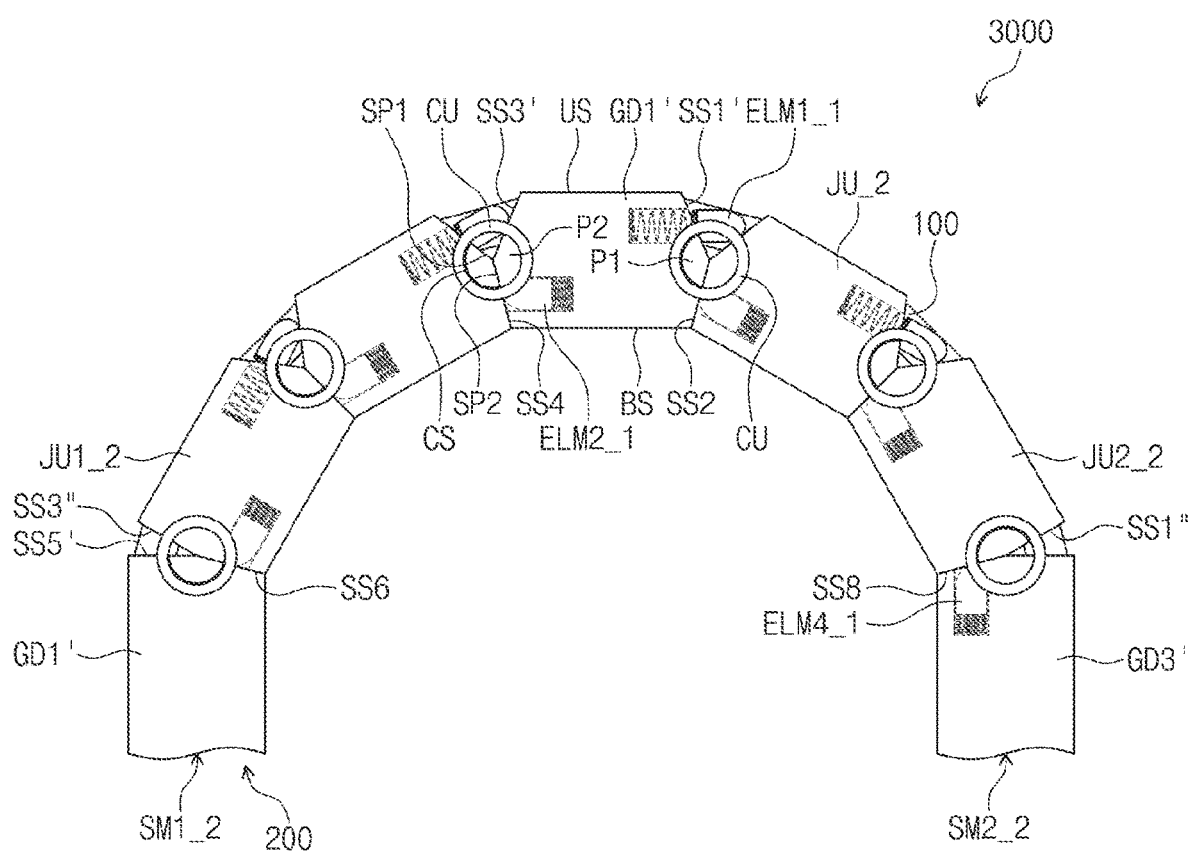
FIG. 26 is a view illustrating a state in which the display apparatus in FIG. 25 is out-folded according to some exemplary embodiments.
Figure 27:
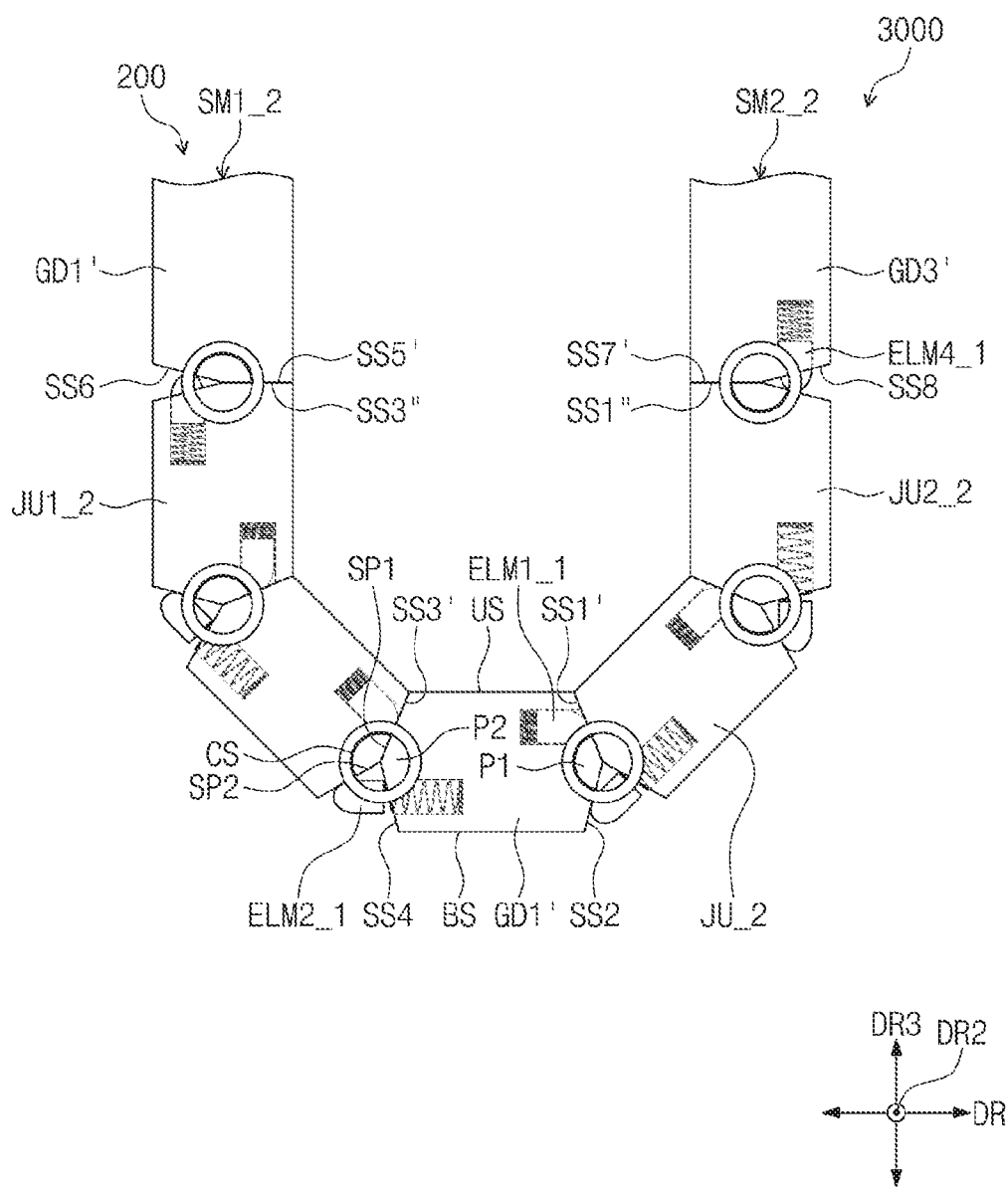
FIG. 27 is a view illustrating a state in which the display apparatus in FIG. 25 is in-folded according to some exemplary embodiments.

FIG. 26 is a view illustrating a state in which the display apparatus in FIG. 25 is out-folded according to some exemplary embodiments. FIG. 27 is a view illustrating a state in which the display apparatus in FIG. 25 is in-folded according to some exemplary embodiments.

Referring to FIGS. 26 and 27, as the joint units JU_2 and the first and second support members SM1_2 and SM2_2 rotate, the display apparatus 3000 may be out-folded or in-folded. A first angle θ1' formed between the first side surface SS1' and the third side surface SS3', which are adjacent to each other, is greater than a second angle θ2 formed between the second side surface SS2 and the fourth side surface SS4, which are adjacent to each other. Accordingly, the display apparatus 3000 is bent greater when out-folded than when in-folded. That is, a curvature of the folding area FA when the display apparatus 3000 is in-folded is greater than that of the folding area FA when the display apparatus 3000 is out-folded.

As the display apparatus 3000 is out-folded or in-folded at different curvatures, convenience of a user may be enhanced. Also, the display apparatus 3000 may be easily in-folded or out-folded, and restored to the flat state again after being in-folded or out-folded.

Figure 28:
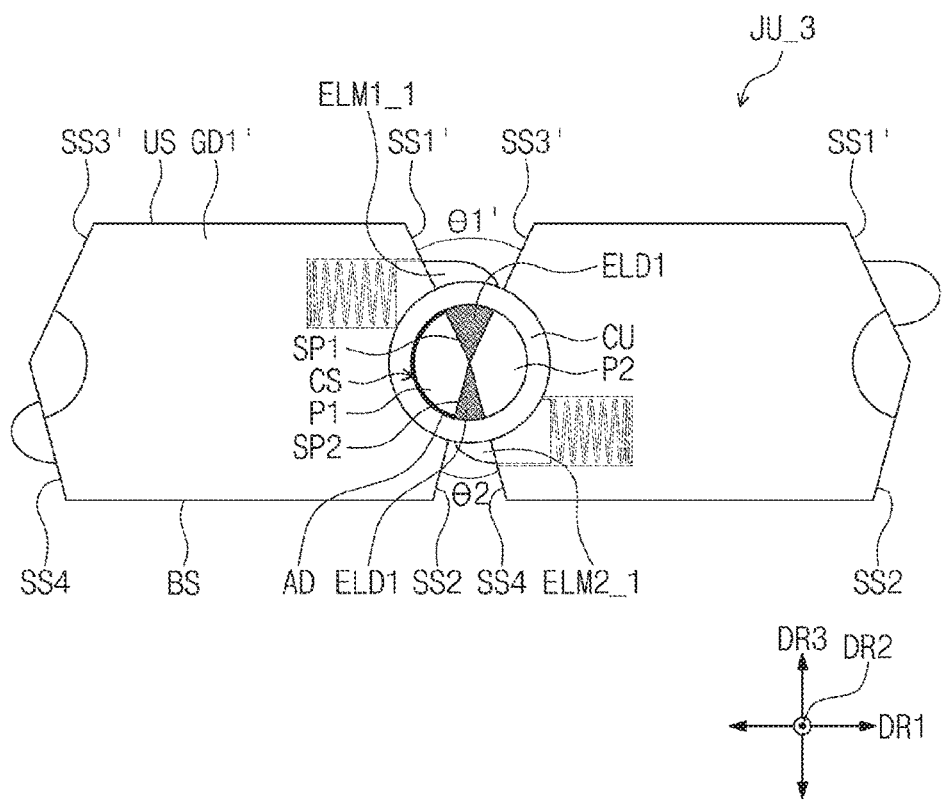
FIGS. 28 and 29 are views illustrating joint units used for the display apparatus in FIG. 25 according to various exemplary embodiments.
Figure 29:
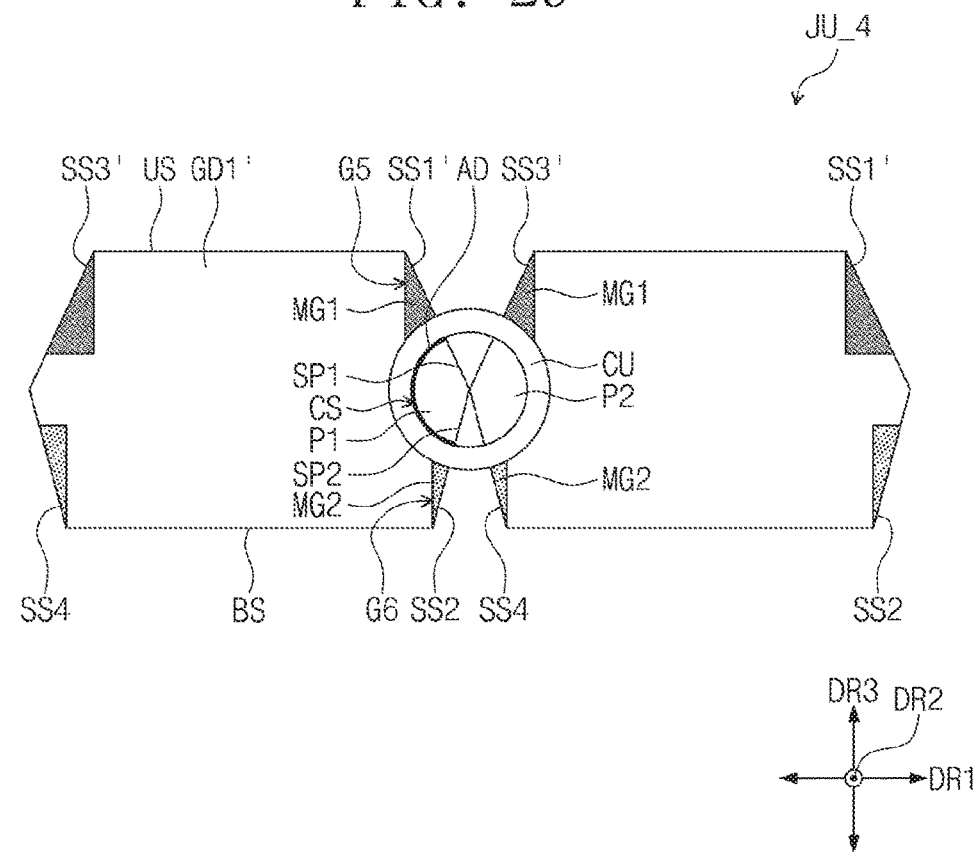

FIGS. 28 and 29 are views illustrating joint units used for the display apparatus in FIG. 25 according to various exemplary embodiments.

Hereinafter, components of joint units JU_3 and JU_4 in FIGS. 28 and 29, especially components different from those of the joint units JU_2 in FIG. 24, will be mainly described.

Referring to FIG. 28, a plurality of elastic bodies ELD1 are disposed between the first inclined surface SP1 of the first protruding part P1 and the first inclined surface SP1 of the second protruding part P2, which are adjacent to each other, and between the second inclined surface SP2 of the first protruding part P1 and the second inclined surface SP2 of the second protruding part P2, which are adjacent to each other, respectively. The joint units JU_3 have the same components as those of the joint units JU_2 in FIG. 24 except that the elastic bodies ELD1 are additionally disposed. The display apparatus may be further easily restored to the flat state by the elastic bodies ELD1 after the display apparatus is in-folded or out-folded.

Referring to FIG. 29, a plurality of first magnet units MG1 having polarities different from each other are disposed in a plurality of fifth grooves G5 defined in first side surfaces SS1' and third side surfaces SS3' of joint units JU_4. A plurality of second magnet units MG2 having polarities different from each other are disposed in a plurality of sixth grooves G6 defined in second side surfaces SS2 and fourth side surfaces SS4 of the joint units JU_4. The first magnet units MG1 and the second magnet units MG2 have the polarities opposite to each other. The first and second elastic members ELM1_1 and ELM2_1 are not disposed in the joint units JU_4, unlike the joint units JU_2 in FIG. 24.

Since the first magnet units MG1 having the same polarity are disposed on the first side surface SS1' and the third side surface SS3', which are adjacent to each other, a repulsive force may be applied to the first side surface SS1' and the third side surface SS3'. Since the second magnet units MG2 having the same polarity are disposed on the second side surface SS2 and the fourth side surface SS4, which are adjacent to each other, a repulsive force may be applied to the second side surface SS2 and the fourth side surface SS4. Resultantly, the display apparatus may be restored to the flat state by the first and second magnet units MG1 and MG2 after the display apparatus is in-folded or out-folded.

According to various exemplary embodiments, a display apparatus may be in-folded and out-folded by joint units of a support member. Also, the in-folded or out-folded display apparatus may be restored to a flat state by elastic members or magnetic members disposed in the joint units of the support member.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display apparatus comprising:
   a first support member;
   a second support member arranged in a first direction from the first support member;
   joint units arranged in the first direction, extending in a second direction crossing the first direction, and disposed between the first and second support members; and
   a display module disposed on the first and second support members and the joint units, the display module being flexible,
   wherein each of the joint units comprises:
     a body part extending in the second direction; and
     protruding parts disposed on opposing sides of the body part when viewed in the first direction, each of the protruding parts having a fan shape and being disposed on a corresponding upper end of the body part when viewed in the second direction, wherein each of the protruding parts comprises:
a curved surface defined as an arc of the fan shape;
a first inclined surface defined as a first radii of the fan shape; and
a second inclined surface defined as a second radii of the fan shape, an angle formed between the first inclined surface and a third direction perpendicular to a plane parallel with the first and second directions is equivalent to an angle formed between the second inclined surface and the third direction, and
wherein the curved surfaces of some of the protruding parts that are disposed on a same upper end of the body part face each other.

2. The display apparatus of claim 1, wherein the body part of each joint unit comprises:
a first protruding part of the protruding parts, the first protruding part being disposed on one side of the opposing sides of an upper end of the body part; and
a second protruding part of the protruding parts, the second protruding part being disposed on the other side of the opposing sides of an upper end of the body part.

3. The display apparatus of claim 2, further comprising:
connecting units coupling the joint units in a mutually rotatable manner,
wherein the first protruding part of a first joint unit of the joint units and the second protruding part of a second joint unit of the joint units adjacent to the first joint unit are disposed in a connecting unit of the connecting units.

4. The display apparatus of claim 3, wherein a vertex of the fan shape of the first protruding part of the first joint unit and a vertex of the fan shape of the second protruding part of the second joint unit are adjacent to each other.

5. The display apparatus of claim 4, wherein:
each of the connecting units has a ring shape;
the curved surface of the first protruding part of the first joint unit that is disposed in the connecting unit is connected to the connecting unit; and
the first joint unit and the second joint unit rotate each other with respect to a rotation shaft extending in the second direction at a center point of the ring shape of the connecting unit.

6. The display apparatus of claim 2, wherein:
the first inclined surface is disposed on the second inclined surface;
the body part has a reverse trapezoidal shape when viewed in the second direction;
a vertex connecting a first inclined surface and a second inclined surface of the first protruding part overlaps a vertex connecting a top surface and one side surface of the body part, the second inclined surface of the first protruding part overlapping an upper portion of the one side surface of the body part when viewed in the second direction; and
a vertex connecting a first inclined surface and a second inclined surface of the second protruding part overlaps a vertex connecting the top surface and another side surface of the body part, the another side surface being an opposite side surface of the one side surface of the body part, the second inclined surface of the second protruding part overlapping an upper portion of the another side surface of the body part when viewed in the second direction.

7. The display apparatus of claim 6, further comprising:
first elastic members respectively disposed in first grooves defined in the one side surface of the body part; and
a second elastic member disposed in a second groove defined in the first inclined surface of the first protruding part.

8. The display apparatus of claim 7, wherein each of the first elastic members comprises:
a first elastic unit disposed in a corresponding first groove of the first grooves; and
a first push unit disposed on an end of the first elastic unit and exposed to the outside through the corresponding first groove, the first push unit being disposed adjacent to the another side surface of the body part of a joint unit among the joint units that is adjacent to the first push unit.

9. The display apparatus of claim 7, wherein the second elastic member comprises:
a second elastic unit disposed in the second groove; and
a second push unit disposed on an end of the second elastic unit and exposed to the outside through the second groove, the second push unit being disposed adjacent to the first inclined surface of the second protruding part adjacent to the second push unit.

10. The display apparatus of claim 6, further comprising:
a third protruding part disposed on each of opposing sides of the first support member when viewed in the first direction, the third protruding parts being disposed on upper ends of one side of the first support member and having a same shape as the first protruding part when viewed in the second direction;
a fourth protruding part disposed on each of opposing sides of the second support member when viewed in the first direction, the fourth protruding parts being disposed on upper ends of one side of the second support member and having a same shape as the second protruding part when viewed in the second direction; and
connecting units, some of the connecting units coupling, in a mutually rotatable manner, the third protruding parts to the second protruding parts of a joint unit of the joint units that is adjacent to the third protruding parts, and some of the connecting units coupling, in a mutually rotatable manner, the fourth protruding parts to the first protruding parts of a joint unit of the joint units that is adjacent to the fourth protruding parts,
wherein the one side of the first support member faces the one side of the second support member.

11. The display apparatus of claim 10, wherein:
the one side surface of the first support member is symmetric with the another side surface of the body part of a joint unit of the joint units that is adjacent to the first support member; and
one side surface of the second support member that faces the one side surface of the first support member is symmetric with one side surface of the body part of a joint unit of the joint units that is adjacent to the second support member.

12. The display apparatus of claim 11, further comprising:
third elastic members respectively disposed in third grooves defined in the one side of the first support member; and
a fourth elastic member disposed in a fourth groove defined in the first inclined surface of a third protruding part of the third protruding parts.

13. The display apparatus of claim 12, wherein each of the third elastic members comprises:
a third elastic unit disposed in a corresponding third groove of the third grooves; and
a third push unit disposed on an end of the third elastic unit and exposed to the outside through the corresponding third groove, the third push unit being disposed adjacent to the another side surface of the body part of a joint unit of the joint units that is adjacent to the third push unit.

14. The display apparatus of claim 12, wherein the fourth elastic member comprises:
   a fourth elastic unit disposed in a fourth groove; and
   a fourth push unit disposed on an end of the fourth elastic unit and exposed to the outside through the fourth groove, the fourth push unit being disposed adjacent to the first inclined surface of the second protruding part adjacent to the fourth push unit.

15. The display apparatus of claim 11, wherein:
   when the display module is out-folded so that the display module is exposed to the outside, second inclined surfaces of the first, second, third, and fourth protruding parts contact each other, the one side surfaces and the another side surfaces of the body parts of the joint units contact each other, and the one side surface of the first support member and the other side surface of the joint unit adjacent to the first support member contact each other; and
   when the display module is in-folded so that the display module is not exposed to the outside, first inclined surfaces of the first, second, third, and fourth protruding parts contact each other.

16. The display apparatus of claim 2, wherein the display module comprises:
   a first non-folding area disposed on the first support member;
   a second non-folding area disposed on the second support member; and
   a folding area disposed between the first and second non-folding areas, the folding area being disposed on the body parts of the joint units.

17. The display apparatus of claim 2, further comprising:
   an elastic body disposed between the first inclined surface of the first protruding part of a first joint unit of the joint units and the second inclined surface of the second protruding part of a second joint unit of the joint units,
   wherein the first protruding part of the first joint unit and the second protruding part of the second joint unit are adjacent to each other.

18. A display apparatus comprising:
   a first support member;
   a second support member arranged in a first direction from the first support member;
   joint units arranged in the first direction, extending in a second direction crossing the first direction, and disposed between the first and second support members; and
   a display module disposed on the first and second support members and the joint units, the display module being flexible,
   wherein each of the joint units comprises:
      a first body part extending in the second direction;
      first guide parts disposed on opposing sides of the first body part when viewed in the first direction; and
      protruding parts disposed on opposing sides of the first guide parts when viewed in the second direction, each of the protruding parts having a fan shape,
   wherein each of the protruding parts comprises:
      a curved surface defined as an arc of the fan shape;
      a first inclined surface defined as a first radii of the fan shape; and
      a second inclined surface defined as a second radii of the fan shape, an angle formed between the first inclined surface and a third direction perpendicular to a plane parallel with the first and second directions is equivalent to an angle formed between the second inclined surface and the third direction, and
   wherein the curved surfaces of the protruding parts respectively disposed on opposing sides of each of the first guide parts face each other.

19. The display apparatus of claim 18, wherein the protruding parts disposed on the opposing sides of each of the first guide parts comprise:
   a first protruding part disposed on one side of the opposing sides of each of the first guide parts; and
   a second protruding part disposed on the other side of the opposing sides of each of the first guide parts.

20. The display apparatus of claim 19, further comprising:
   connecting units coupling the joint units in a mutually rotatable manner,
   wherein the first protruding part of a first joint unit of the joint units and the second protruding part of a second joint unit of the joint units adjacent to the first joint unit are disposed in a connecting unit of the connecting units, and
   wherein a vertex of the fan shape of the first protruding part of the first joint unit and a vertex of the fan shape of the second protruding part of the second joint unit are adjacent to each other.

21. The display apparatus of claim 20, wherein:
   each of the connecting units has a ring shape;
   the curved surface of the first protruding part of the first joint unit that is disposed in the connecting unit is connected to the connecting unit; and
   the first joint unit and the second joint unit rotate with respect to a rotation shaft extending in the second direction at a center point of the ring shape of the connecting unit.

22. The display apparatus of claim 19, wherein:
   the first body part has a plane parallel with the first direction and the second direction;
   the first guide part has a hexagonal shape when viewed in the second direction;
   the first guide part has a thickness greater than that of the body part in the third direction;
   the first and second protruding parts are disposed on outer surfaces of the first guide parts that are opposite side surfaces of inner surfaces, which face each other.

23. The display apparatus of claim 22, wherein each of the first guide parts comprises:
   a top surface extending in the first direction and being parallel with the first body part, the top surface being disposed higher than the first body part;
   a bottom surface extending in the first direction and being parallel with the first body part, the bottom surface overlapping the top surface and being disposed lower than the first body part;
   a first side surface connected to one side of the top surface when viewed from the second direction;
   a second side surface connected to an end of the first side surface and one side of the bottom surface disposed below the one side of the top surface when viewed from the second direction;
   a third side surface connected to the other side of the top surface that is an opposite side of the one side of the top surface when viewed from the second direction; and
   a fourth side surface connected to an end of the third side surface and the other side of the bottom surface that is an opposite side of the one side of the bottom surface when viewed from the second direction, and an angle between the first side surface and the second side surface and an angle between the third side surface and the fourth side surface are equivalent and less than 180°.

24. The display apparatus of claim 23, wherein a first angle between the first side surface and the third side surface of first guide parts adjacent to each other among the first guide parts of the joint units is equivalent to a second angle between the third side surface and the fourth side surface of first guide parts adjacent to each other among the first guide parts of the joint units.

25. The display apparatus of claim 23, wherein:
a vertex connecting the first inclined surface and the second inclined surface of the first protruding part overlaps a vertex connecting the first side surface and the second side surface when viewed in the second direction;
a vertex connecting the first inclined surface and the second inclined surface of the second protruding part overlaps a vertex connecting the third side surface and the fourth side surface when viewed in the second direction; and
the first inclined surface of the first protruding part is parallel with the first side surface, the second inclined surface of the first protruding part is parallel with the second side surface, the first inclined surface of the second protruding part is parallel with the third side surface, and the second inclined surface of the second protruding part is parallel with the fourth side surface.

26. The display apparatus of claim 23, further comprising:
a first elastic unit disposed in a first groove defined in the first side surface; and
a second elastic unit disposed in a second groove defined in the third side surface,
wherein the first elastic member comprises:
a first elastic unit disposed in the first groove; and
a first push unit disposed on an end of the first elastic unit and exposed to the outside through the first groove,
wherein the second elastic member comprises:
a second elastic unit disposed in the second groove; and
a second push unit disposed on an end of the second elastic unit and exposed to the outside through the second groove, and
wherein the first push unit is disposed adjacent to the third side surface of a first guide part of the first guide parts adjacent to the first push unit, and the second push unit is disposed adjacent to the second side surface of a first guide part of the first guide parts adjacent to the second push unit.

27. The display apparatus of claim 23, wherein:
the first support member comprises:
a second body part parallel with the first body part;
second guide parts disposed on opposing sides of the second body part and extend in the first direction when viewed in the first direction; and
a third protruding part disposed on each of one sides of the second guide parts when viewed in the second direction;
the second support member comprises:
a third body part parallel with the first body part;
third guide parts disposed on opposing sides of the third body part and extend in the first direction when viewed in the first direction; and
a fourth protruding part disposed on each of one sides of the third guide parts that face one sides of the second guide parts when viewed in the second direction;
the one side of each of the second guide parts comprises:
a fifth side surface symmetric with the third side surface; and
a sixth side surface symmetric with the fourth side surface;
one side surface of each of the third guide parts that faces the one side surface of each of the second guide parts comprises:
a seventh side surface symmetric with the first side surface; and
a eighth side surface symmetric with the second side surface.

28. The display apparatus of claim 27, wherein the display module comprises:
a first non-folding area disposed on the second body part;
a second non-folding area disposed on the third body part; and
a folding area disposed between the first and second non-folding areas, the folding area being disposed on the first body parts of the joint units.

29. The display apparatus of claim 27, further comprising:
a third elastic member disposed in a third groove defined in the fifth side surface;
a fourth elastic member disposed in a fourth groove defined in the eight side surface; and
connecting units, some of the connecting units coupling, in a mutually rotatable manner, the third protruding part and the second protruding part of a joint unit of the joint units that is adjacent to the third protruding part, and some of the connecting units coupling, in a mutually rotatable manner, the fourth protruding part and the first protruding part of a joint unit of the joint units that is adjacent to the fourth protruding part,
wherein the third elastic member comprises:
a third elastic unit disposed in the third groove; and
a third push unit disposed on an end of the third elastic unit and exposed to the outside through the third groove,
wherein the fourth elastic member comprises:
a fourth elastic unit disposed in the fourth groove; and
a fourth push unit disposed on an end of the fourth elastic unit and exposed to the outside through the fourth groove, and
wherein the third push unit is disposed adjacent to the third side surface of a first guide part of the first guide parts that is adjacent to the third push unit, and the fourth push unit is disposed adjacent to the second side surface of a first guide part of the first guide parts that is adjacent to the fourth push unit.

30. The display apparatus of claim 27, wherein a first angle between the first side surface and the third side surface of the first guide parts that are adjacent to each other among the first guide parts of the joint units is greater than a second angle between the third side surface and the fourth side surface of the first guide parts that are adjacent to each other among the first guide parts of the joint units.

31. The display apparatus of claim 30, wherein the third side surface of each of the first guide parts of the joint unit adjacent to the first support member, the first side surface of each of the first guide parts of the joint unit adjacent to the second support member, the fifth side surface, and the seventh side surface are parallel with the third direction.

32. The display apparatus of claim 23, further comprising:

first magnet units respectively disposed in fifth grooves defined in the first and third side surfaces, the first magnet units having the same polarity as each other; and second magnet units respectively disposed in sixth grooves defined in the second and fourth side surfaces, the second magnet units having the same polarity as each other; and the first magnet units and the second magnet units have polarities different from each other.

33. The display apparatus of claim 19, further comprising:

elastic bodies, some of the elastic bodies being disposed between the first inclined surface of the first protruding part of a first joint unit of the joint units and the first inclined surface of the second protruding part of a second joint unit of the joint units that is adjacent to the first joint unit, and some of the elastic bodies being disposed between the second inclined surface of the first protruding part of the first joint unit and the second inclined surface of the second protruding part of the second joint unit.

34. A support member comprising:

a first support member;

a second support member arranged in a first direction from the first support member;

joint units arranged in the first direction, extending in a second direction crossing the first direction, and disposed between the first and second support members; and connecting units coupling the first support member, the second support member, and the joint units to each other in a mutually rotatable manner, wherein each of the joint units comprises:
  a body part extending in the second direction; and
  protruding parts disposed on opposing sides of the body part when viewed in the first direction, each of the protruding parts having a fan shape and being disposed on opposing sides of an upper end of the body part when viewed in the second direction, wherein each of the protruding parts comprises:
  a curved surface defined as an arc of the fan shape;
  a first inclined surface defined as a first radii of the fan shape; and
  a second inclined surface defined as a second radii of the fan shape, wherein the curved surfaces of some of the protruding parts that are disposed on the upper end of the body part face each other, wherein an angle formed between the first inclined surface and a third direction perpendicular to a plane parallel with the first and second directions is equivalent to an angle formed between the second inclined surface and the third direction, and wherein the first protruding part of a first joint unit of the joint units and the second protruding part of a second joint unit of the joint units that is adjacent to the first joint unit are disposed in a connecting unit of the connecting units.

\* \* \* \* \*